United States Patent
Lim et al.

(10) Patent No.: US 11,238,927 B2
(45) Date of Patent: Feb. 1, 2022

(54) MEMORY DEVICE HAVING PROGRAM CURRENT ADJUSTIBLE BASED ON DETECTED HOLDING VOLTAGE

(71) Applicant: SAMSUNG ELECTRONICS CO., LTD., Suwon-si (KR)

(72) Inventors: Cheaouk Lim, Suwon-si (KR); Jung Sunwoo, Suwon-si (KR); Kwangjin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/881,351

(22) Filed: May 22, 2020

(65) Prior Publication Data

US 2021/0118485 A1 Apr. 22, 2021

(30) Foreign Application Priority Data

Oct. 22, 2019 (KR) .................. 10-2019-0131417

(51) Int. Cl.
*G11C 13/00* (2006.01)
*G11C 11/408* (2006.01)
*G11C 11/56* (2006.01)
*G11C 11/4074* (2006.01)
*G11C 11/4094* (2006.01)

(52) U.S. Cl.
CPC ...... *G11C 13/0004* (2013.01); *G11C 11/4074* (2013.01); *G11C 11/4085* (2013.01); *G11C 11/4087* (2013.01); *G11C 11/4094* (2013.01); *G11C 11/5628* (2013.01); *G11C 11/5642* (2013.01); *G11C 13/003* (2013.01); *G11C 13/004* (2013.01); *G11C 13/0023* (2013.01); *G11C 13/0069* (2013.01)

(58) Field of Classification Search
CPC ............ G11C 13/0004; G11C 13/0021; G11C 13/0023; G11C 13/0028; G11C 13/003; G11C 13/0064
See application file for complete search history.

(56) References Cited

U.S. PATENT DOCUMENTS

| | | | |
|---|---|---|---|
| 6,928,022 B2 | 8/2005 | Cho et al. | |
| 7,948,795 B2 | 5/2011 | Hidaka | |
| 9,257,178 B1* | 2/2016 | Chou | ............... G11C 13/0069 |
| 9,355,720 B2 | 5/2016 | Ahn et al. | |

(Continued)

FOREIGN PATENT DOCUMENTS

KR 10-0939118 1/2010

*Primary Examiner* — Alfredo Bermudez Lozada
(74) *Attorney, Agent, or Firm* — F. Chau & Associates, LLC

(57) ABSTRACT

A memory device includes a plurality of memory cells, each memory cell including a switching element and a data storage element having a phase change material, and each memory cell connected to one of a plurality of wordlines and to one of a plurality of bitlines, a decoder circuit configured to determine at least one of the plurality of memory cells as a selected memory cell, and a programming circuit configured to input a program current to the selected memory cell to perform a program operation, to detect a holding voltage of the selected memory cell, and to adjust a magnitude of the program current based on the detected holding voltage. The selected memory cell is turned off when a voltage across the selected memory cell is lower than the holding voltage.

20 Claims, 30 Drawing Sheets

(56) References Cited

U.S. PATENT DOCUMENTS

| | | | |
|---|---|---|---|
| 9,548,114 B2 | 1/2017 | Kwon et al. | |
| 9,842,638 B1 | 12/2017 | Li et al. | |
| 2004/0022085 A1* | 2/2004 | Parkinson | G11C 13/004 365/113 |
| 2010/0165720 A1* | 7/2010 | Lin | G11C 13/0069 365/163 |
| 2013/0051123 A1 | 2/2013 | Lee et al. | |
| 2016/0042788 A1* | 2/2016 | Ahn | G11C 13/0061 365/148 |
| 2018/0358085 A1* | 12/2018 | Em | G11C 11/4074 |

* cited by examiner

MEMORY DEVICE HAVING PROGRAM CURRENT ADJUSTABLE BASED ON DETECTED HOLDING VOLTAGE

CROSS-REFERENCE TO RELATED APPLICATION(S)

This U.S. non-provisional patent application claims benefit of priority under 35 U.S.C. 119(a) to Korean Patent Application No. 10-2019-0131417 filed on Oct. 22, 2019 in the Korean Intellectual Property Office, the disclosure of which is incorporated by reference in its entirety herein.

BACKGROUND

1. Technical Field

The present disclosure relates to a memory device, and more particularly to a resistive memory device.

2. Discussion of Related Art

Resistive memory devices include a phase change random access memory (PRAM), a resistive RAM (ReRAM), and a magnetic RAM (MRAM). Unlike memory devices that write data by charging or discharging electric charges, a resistive memory device writes or erases data using changes in resistance. The resistance of a memory cell in a resistive memory device may be changed when a current is applied to the memory cell.

The application of the current may heat the memory cell until a material within the memory cell changes its state from a first state having a first resistance to a second state having a second other resistance. However, the heating may be insufficiently generated as the resistance of the memory cell increases. Thus, a program operation may not be normally performed on the memory cell. Further, the heating may be excessively generated as the resistance of the memory cell is increased. Thus, endurance of the memory cell may be reduced.

SUMMARY

Exemplary embodiments of the inventive concept provide a memory device in which distribution of memory cells may be prevented from being broadened in a program operation.

According to an exemplary embodiment of the inventive concept, a memory device includes a plurality of memory cells, each memory cell including a switching element and a data storage element having a phase change material, and each memory cell connected to one of a plurality of wordlines and to one of a plurality of bitlines, a decoder circuit configured to determine at least one of the plurality of memory cells as a selected memory cell, and a programming circuit configured to input a program current to the selected memory cell to perform a program operation, to detect a holding voltage of the selected memory cell, and to adjust a magnitude of the program current based on the detected holding voltage. The selected memory cell is turned off when a voltage across the selected memory cell is lower than the holding voltage.

According to an exemplary embodiment of the inventive concept, a memory device includes a memory cell array including a plurality of memory cells disposed at intersections of a plurality of wordlines and a plurality of bitlines, a decoder circuit configured to determine at least one of the plurality of memory cells as a selected memory cell, and a programming circuit configured to input a program current to the selected memory cell to perform a program operation, to detect a holding voltage of the selected memory cell, and to adjust a magnitude of the program current based on the detected holding voltage. The holding voltage is a voltage that prevents the selected memory cell from being turned off. The programming circuit detects the holding voltage of the selected memory cell during a pre-reading period and supplies a program current, having a magnitude adjusted by the holding voltage of the selected memory cell, to the selected memory cell during a programming period following the pre-reading period.

According to an exemplary embodiment of the inventive concept, a memory device includes a memory cell array including a plurality of memory cells disposed at intersections of a plurality of wordlines and a plurality of bitlines, a decoder circuit configured to determine at least one of the plurality of memory cells as a selected memory cell, and a programming circuit configured to input a program current to the selected memory cell to perform a program operation, to detect a holding voltage of the selected memory cell, and to adjust a magnitude of the program current based on the detected holding voltage. The holding voltage is a voltage that prevents the selected memory cell from being turned off. The decoder circuit supplies a bias voltage to a selected wordline and a selected bitline, connected to the selected memory cell, during a cell turn-on period to set the selected memory cell to a turned-on state. The programming circuit supplies a minimum current required for the selected memory cell to be maintained in the turned-on state during a holding period following the cell turn-on period, detects a holding voltage of the selected memory cell during a programming period following the holding period, and supplies a program current, having a magnitude adjusted by the holding voltage, to the selected memory cell.

BRIEF DESCRIPTION OF DRAWINGS

Embodiments of the present disclosure will be more clearly understood from the following detailed description, taken in conjunction with the accompanying drawings.

DETAILED DESCRIPTION OF THE EXEMPLARY EMBODIMENTS

Hereinafter, exemplary embodiments of the disclosure will be described with reference to the accompanying drawings.

Figure 1:
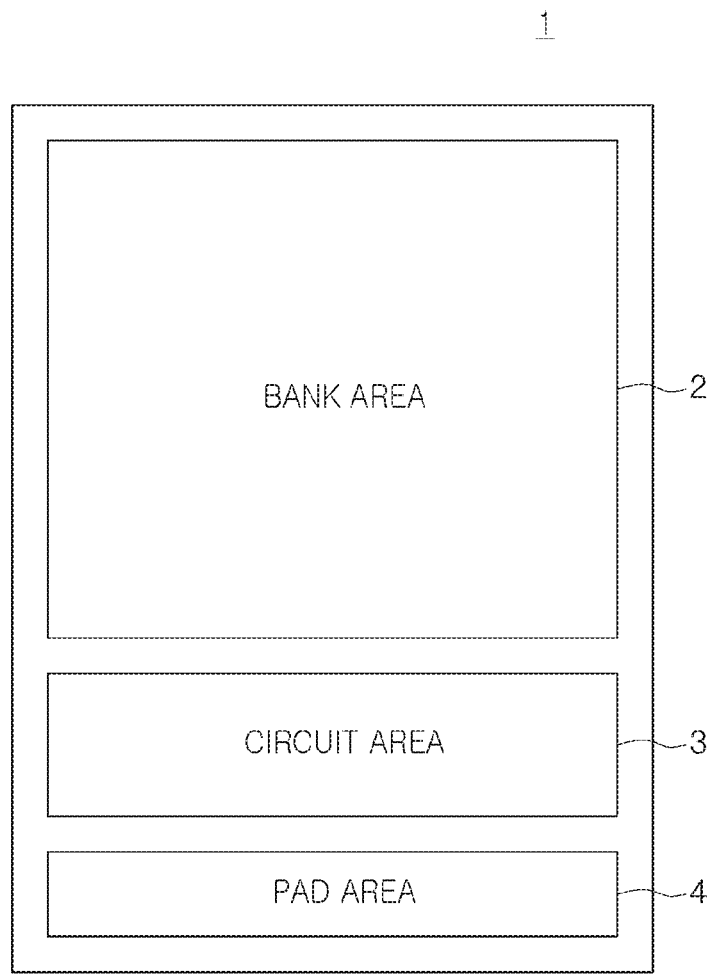
FIGS. 1 and 2 are schematic block diagrams of a memory device according to an exemplary embodiment of the inventive concept.
Figure 2:
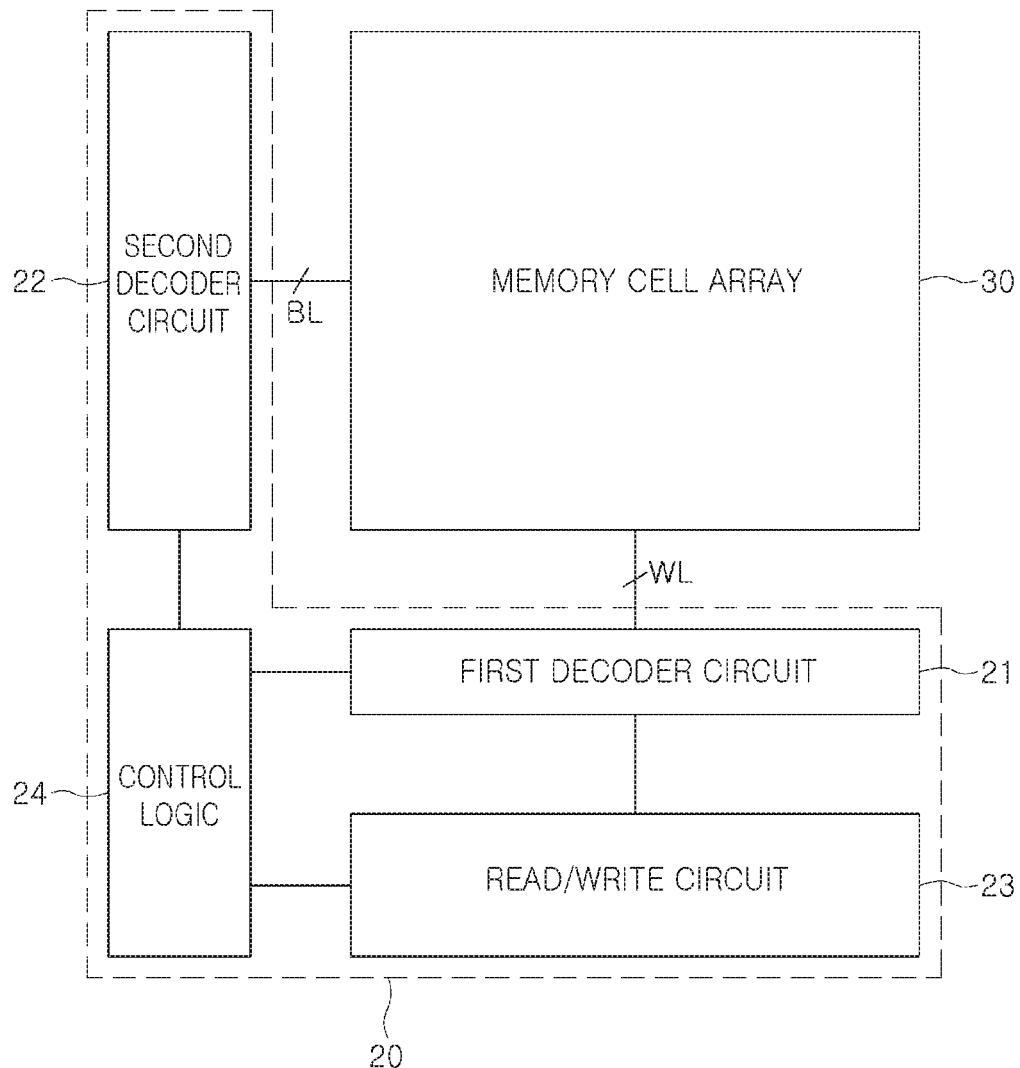

FIGS. 1 and 2 are schematic block diagrams of a memory device according to an exemplary embodiment of the inventive concept.

Referring to FIG. 1, a memory device 1 according to an exemplary embodiment includes a bank area 2, a circuit area 3, and a pad area 4. The pad area 4 may be an area in which a plurality of pads are formed to input and output a control signal or data. The circuit area 3 may be an area in which various circuits required for an operation of the memory device 1 are formed. In the bank region 2, memory cell arrays, each having a plurality of memory cells, are formed. The memory cell arrays may be divided into a plurality of banks.

According to an exemplary embodiment, each of the plurality of banks, formed in the bank area 2, are divided into a plurality of areas. For example, at least a portion of the plurality of areas may share a decoder circuit and/or a read/write circuit included in the circuit region 3.

The circuit area 3 may include a decoder circuit, a read/write circuit, and control logic configured to control the decoder circuit and the read/write circuit. The decoder circuit may determine at least one of the plurality of memory cells, formed in the bank area 2, as a selected memory cell in response to an address, and the read/write circuit may read data from or write data to the selected memory cell.

Referring to FIG. 2, a memory device 10 according to an exemplary embodiment of the inventive concept includes a memory controller 20 (e.g., a control circuit) and a memory cell array 30. The memory controller 20 includes decoder circuits 21 and 22, a read/write circuit 23, and control logic 24. The memory cell array 30 may include a plurality of memory cells. The decoder circuits 21 and 22 include a first decoder circuit 21 connected to the plurality of memory cells through a wordline WL (or multiple wordlines), and a second decoder circuit 22 connected to the plurality of memory cells through a bitline BL (or multiple bitlines). Operations of the first decoder circuit 21, the second decoder circuit 22, and the read/write circuit 23 may be controlled by the control logic 24. In an exemplary embodiment, the read/write circuit 23 includes a programming circuit configured to write data to at least one selected memory cell specified by the first decoder circuit 21, the second decoder circuit 22, and a readout circuit configured to read data from the selected memory cell.

The plurality of memory cells, included in the memory cell array 30, may have different levels of resistance to each other. When the read/write circuit 23 programs data to a selected memory cell, the memory device 10 supplies a program operation to the selected memory cell. When the program operation flows through the selected memory cell, the program operation may not be normally performed or endurance may be reduced depending on a resistance of the selected memory cell.

According to an exemplary embodiment of the inventive concept, when the read/write circuit 23 programs data to the selected memory cell, the memory device 10 determines a program current depending on a resistance of the selected memory cell. Since the memory device 10 may supply different program operations to respective memory cells depending on the resistance of each selected memory cell, the memory device 10 may compensate for a change in program characteristics depending on the resistance of the selected memory cell.

Figure 3A:
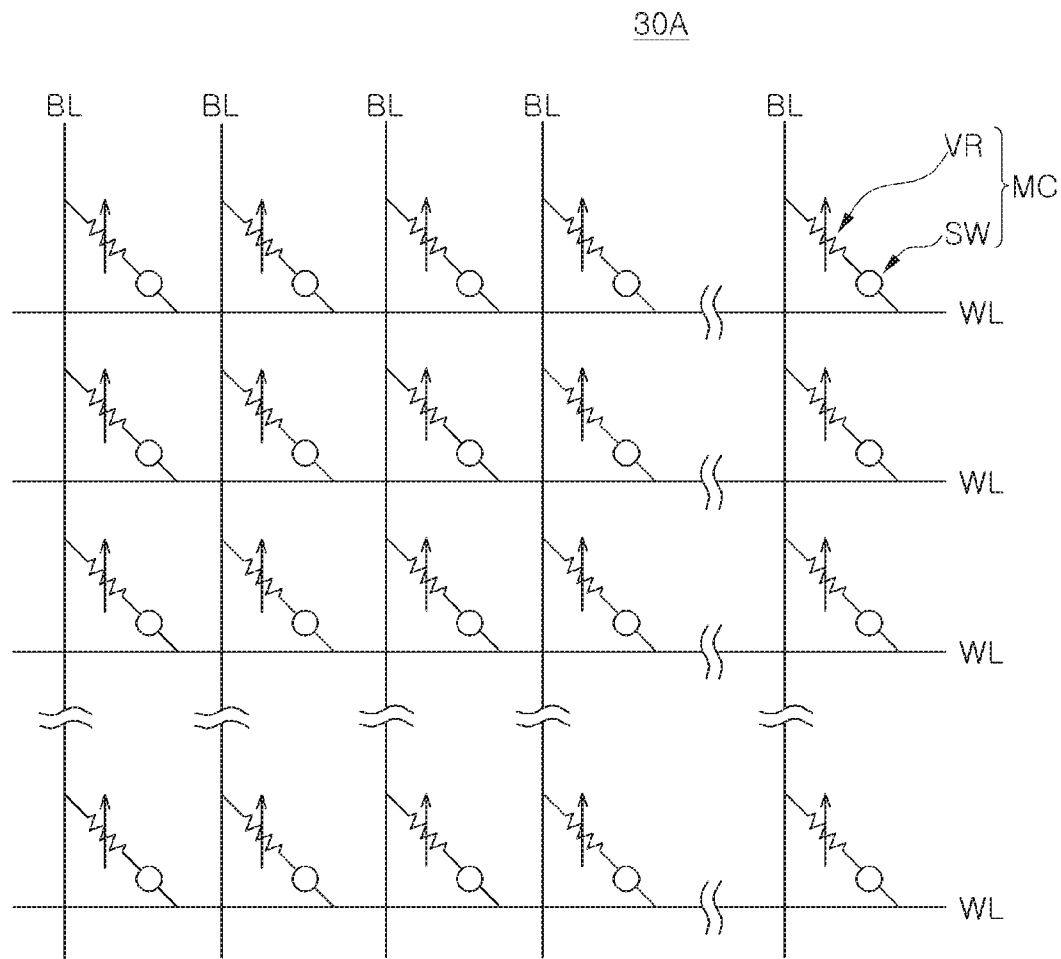
FIGS. 3A and 3B are schematic block diagrams of a memory cell array according to an exemplary embodiment of the inventive concept.
Figure 3B:
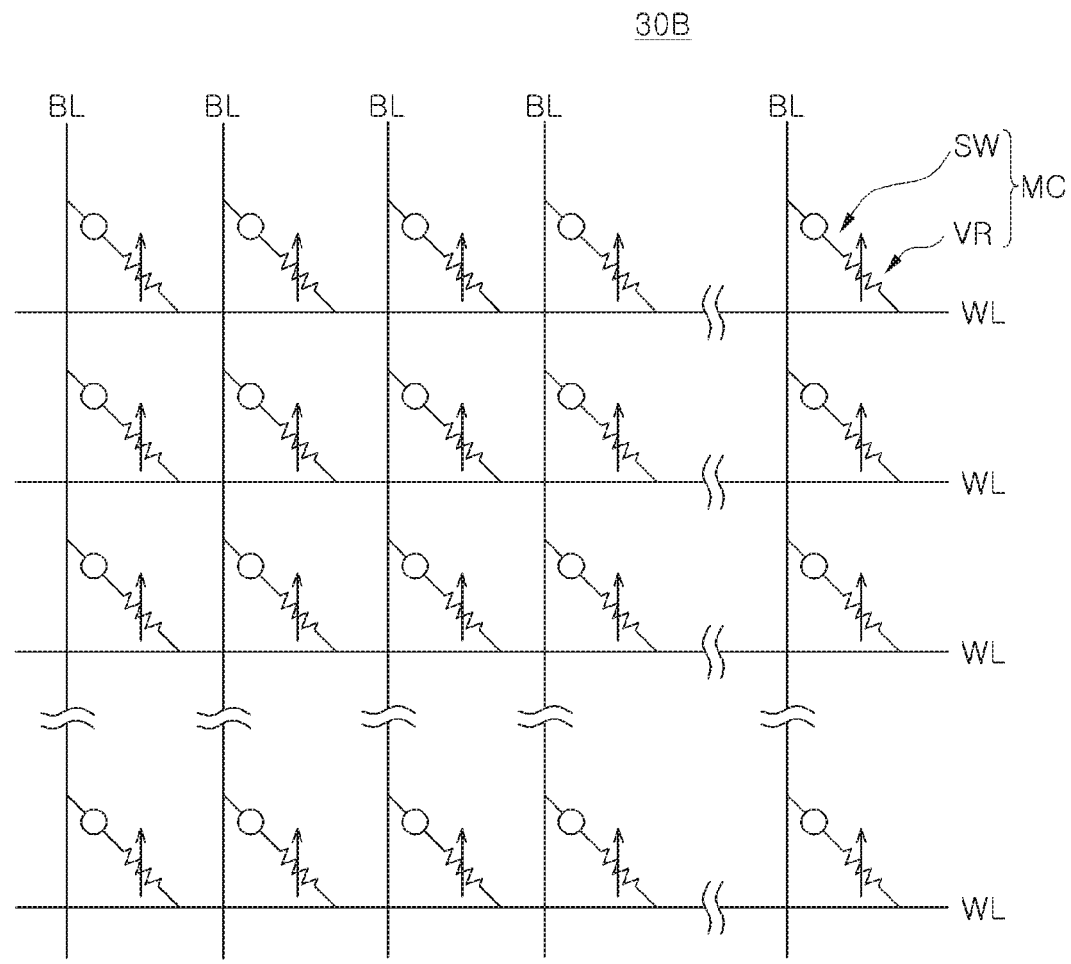

FIGS. 3A and 3B are schematic block diagrams of a memory cell array according to an exemplary embodiment of the inventive concept.

Referring to FIG. 2 and FIG. 3A, a memory cell array 30A according to an exemplary embodiment includes a plurality of memory cells MC. The memory cell array 30a may be used to implement the memory cell array 30 of FIG. 2. The plurality of memory cells MC may be arranged at intersections of bitline BL and wordlines WL. For example, each of the plurality of memory cells MC may be connected to a single bitline BL and a single wordline WL.

As an example, each of the plurality of memory cells MC may include a switching element SW and a data storage element VR. In an exemplary embodiment, the switching element SW may include at least one of a PN junction diode, a Schottky diode, and an ovonic threshold switch (OTS). In an exemplary embodiment, the data storage element VR may be formed of a phase change material including a chalcogenide material or a super-lattice. For example, the data storage element VR may include a phase change material, capable of transitioning between an amorphous phase (or state) and a crystalline phase (or state) depending on a heating time or a heating temperature. The data storage element VR and the switching element SW may be connected to each other in series.

The memory controller 20 may write or erase data by changing a phase of the phase change material of the data storage device VR, included in each of the plurality of memory cells MC, to an amorphous phase or a crystalline phase through the bitline BL and the wordline WL. In an exemplary embodiment, the memory controller 20 increases a resistance of the data storage device VR to write data by changing the phase of the phase change material of the data storage device VR, included in the memory cell MC, to an amorphous phase. In an exemplary embodiment, the memory controller 20 decreases a resistance of the data storage device VR to erase data by changing the phase of the phase change material of the data storage device VR, included in the memory cell MC, to a crystalline phase. A relationship between a resistance value of the data storage device VR and whether data is written may be various defined according to other exemplary embodiments of the inventive concept. The memory controller 20 may perform a read operation to read data from the plurality of memory cells MC by comparing a read voltage, detected from the plurality of memory cells MC, with a reference voltage.

Referring to FIG. 3A, one end of the data storage element VR is connected to a bitline in each of the plurality of memory cells MC, and one end of the switching element SW is connected to a wordline. In this case, each of the plurality of memory cells MC, illustrated in FIG. 3A, have a first orientation.

The description of FIG. 3B will be made with reference to FIG. 3A while focusing on differences from FIG. 3A. The memory cell array 30B of FIG. 3B includes a plurality of memory cells MC. The memory cell array 30 of FIG. 2 may be implemented using the memory cell array 30B of FIG. 3B. Referring to FIG. 3B, one end of the data storage element VR is connected to a wordline, and one end of the switching element SW is connected to a bitline in each of the plurality of memory cells MC. In this case, each of the plurality of memory cells MC, illustrated in FIG. 3B, have a second orientation.

The memory cell array 30 according to an exemplary embodiment of the inventive concept, illustrated in FIG. 2, may include a plurality of memory cells formed on different layers to each other. For example, the memory cell array 30 may include first layers and second layers stacked on each other. Memory cells, included in the first layer, may have the first orientation. Memory cells, included in the second layer, may have a second orientation. However, according to exemplary embodiments, the orientation of memory cells, included in each of the first layer and the second layer, may be changed.

Figure 4A:
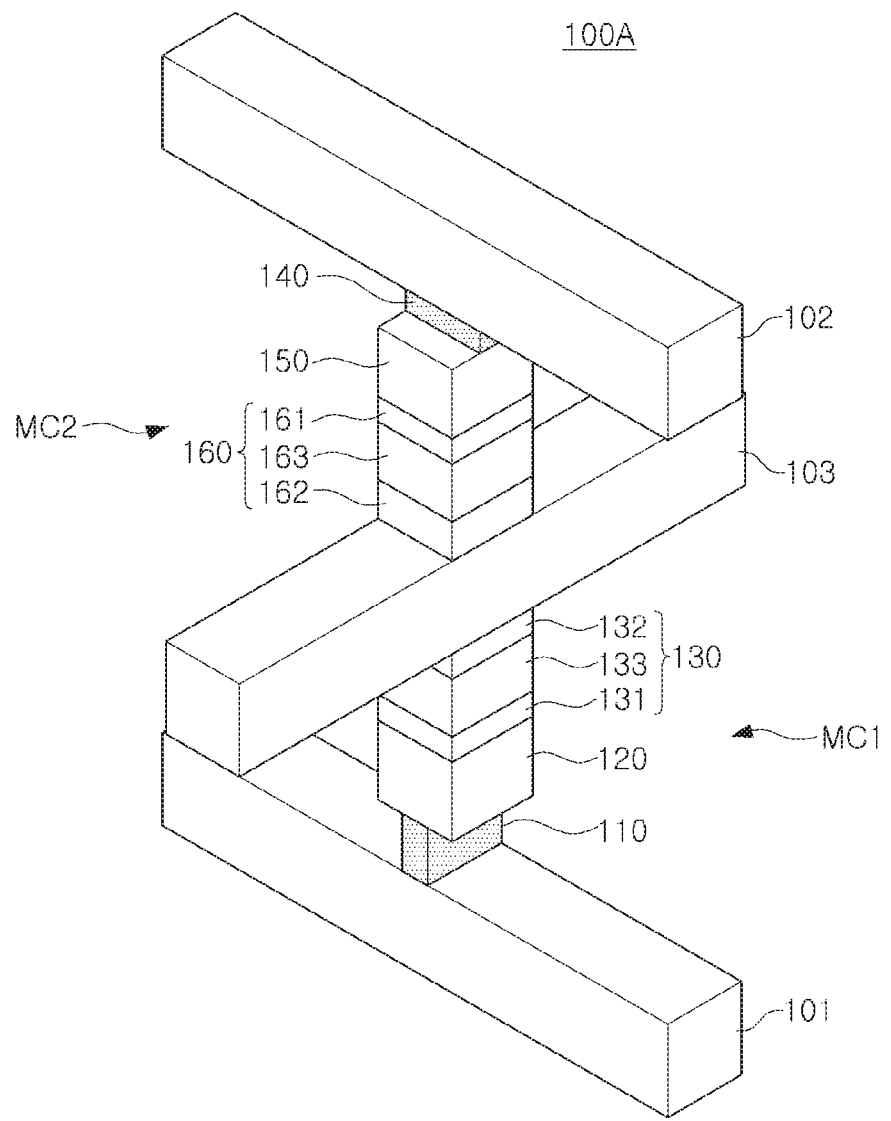
FIGS. 4A and 4B illustrate a structure of a memory cell included in a memory device according to an exemplary embodiment of the inventive concept.
Figure 4B:
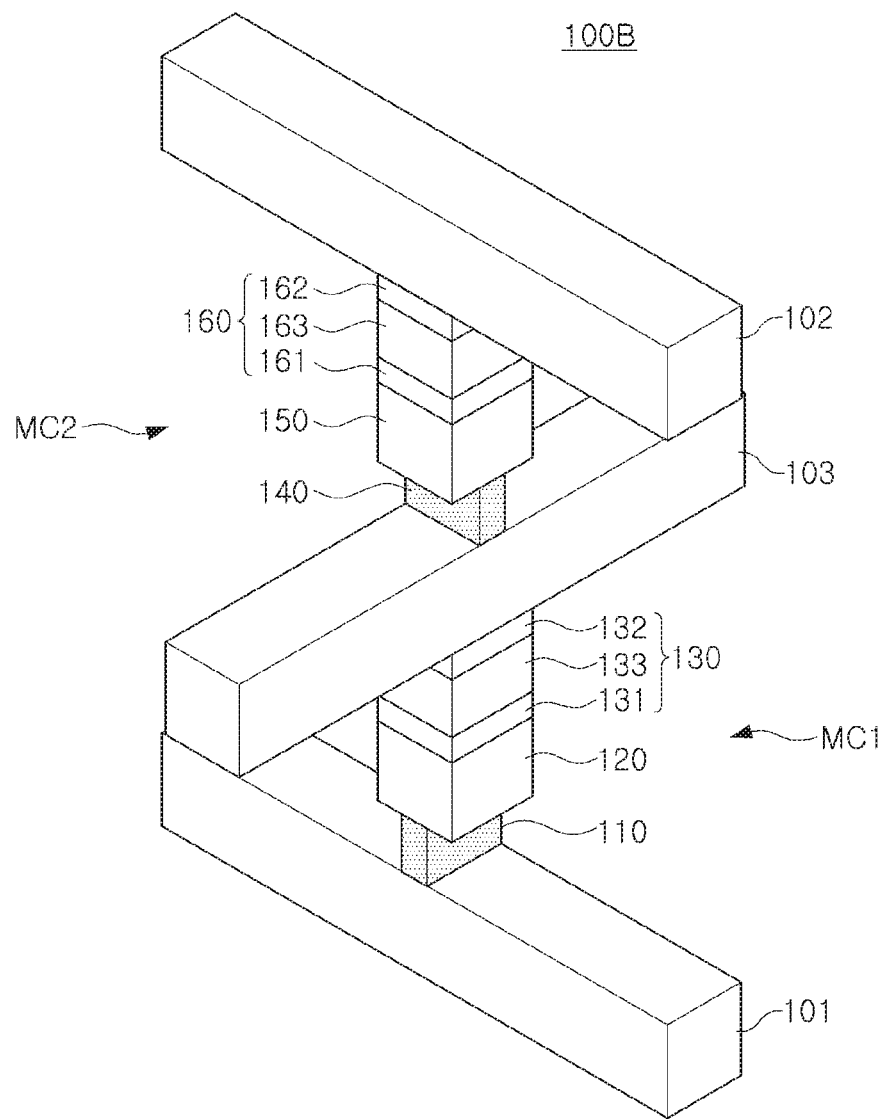

FIGS. 4A and 4B illustrate a structure of a memory cell included in a memory device according to an exemplary embodiment of the inventive concept.

Referring to FIG. 4A, a memory device 100A according to an exemplary embodiment of the inventive concept includes a first memory cell MC1 and a second memory cell MC2 provided between a plurality of conductive lines 101 to 103. The first memory cell MC1 and the second memory cell MC2 may operate as independent memory cells, respectively. As an example, when the first conductive line 101 and the second conductive line 102 are wordlines, a third conductive line 103 may be a bitline. In addition, when the first conductive line 101 and the second conductive line 102 are bitlines, the third conductive line 103 may be a wordline. Hereinafter, for ease of description, it will be assumed that the first conductive line 101 and the second conductive line 102 are a first wordline and a second wordline, respectively.

The first memory cell MC1 includes a first heating electrode 110, a first data storage element 120, and a first switching element 130. The first switching element 130 includes a first switching electrode 131, a second switching electrode 132, and a first selection layer 133 disposed between the first switching electrode 131 and the second switching electrode 132. In an exemplary embodiment, the first selection layer 133 includes an ovonic threshold switching (OTS) material. When a voltage higher than a threshold voltage is supplied between the first switching electrode 131 and the second switching electrode 132, current may flow through the first selection layer 133.

The first data storage element 120 includes a phase change material. In an exemplary embodiment, the first data storage element 120 includes a chalcogenide material. As an example, the first data storage element 120 may include Ge—Sb—Te (GST). A phase change rate depending on a crystallization temperature, a melting point, and crystallization energy of the first data storage element 120 may be determined according to a type and a chemical composition ratio of the elements included in the first information storage element 120.

The second memory cell MC2 may have a structure similar to a structure of the first memory cell MC1. Referring to FIG. 4A, the second memory cell MC2 includes a second heating electrode 140, a second data storage element 150, and a second switching element 160. The structure and the characteristics of each of the second heating electrode 140, the second data storage element 150, and the second switching element 160 may be similar to those of the first heating electrode 110, the first data storage element 120, and the first switching element 130. Hereinafter, a method of writing and erasing data will be described by referring to the first memory cell MC1 as an example.

When a voltage is provided through the first word line 101 and the bit line 102, Joule heating depending on the voltage may be generated on an interfacial surface between the first heating electrode 110 and the first data storage element 120. Due to the Joule heating, a phase of a phase change material, included in the first data storage element 120, may change from an amorphous phase to a crystalline phase or from a crystalline phase to an amorphous phase. In an exemplary embodiment, the first data storage element 120 has a high resistance in an amorphous phase, and has a low resistance in a crystalline phase. In an example embodiment, data "0" or "1" may be defined depending on a resistance value of the first data storage element 120.

To write data to the first memory cell MC1, a program voltage is provided through the first wordline 101 and the bitline 102. In an exemplary embodiment, the program voltage is higher than a threshold voltage of an ovonic threshold switching material included in the first switching device 130. Accordingly, current may flow through the first switching element 130. The phase of the phase change material, included in the first data storage element 120, may change from an amorphous phase to a crystalline phase due to the program voltage to write data into a first memory region. In an exemplary embodiment, when the phase change material included in the first data storage device 120 has a crystalline phase, a state of the first memory cell MC1 is defined as a set state SET.

To erase data written to the first memory cell MC1, the phase of the phase change material, included in the first data storage element 120, is changed from the crystalline phase to the amorphous phase. As an example, a predetermined erase voltage may be provided through the first wordline 101 and the bitline 102. The phase of the phase change material, included in the first data storage element 120, may change from the crystalline phase to the amorphous phase due to the erase voltage. When the phase change material, included in the first data storage element 120, has the amorphous phase, a state of the first memory cell MC1 may be defined as a reset state RESET. In an exemplary embodiment, a maximum value of the erase voltage is higher than a maximum value of the program voltage, and a time during which the erase voltage is provided is shorter than a time during which the program voltage is provided.

As described above, resistance values of the data storage elements 120 and 150 may change depending on states of the phase change materials included in the data storage elements 120 and 150. A memory controller may distinguish data "0" and data "1" from each other based on the resistance values of the data storage devices 120 and 150. Thus, the greater a difference in resistance between the data storage elements 120 and 150 caused by a phase of the phase change material included in the data storage elements 120 and 150, the more precisely the memory controller reads data.

The description will be made with reference to FIG. 4B while focusing on differences from FIG. 4A. Referring to FIG. 4B, a memory device 100B according to an exemplary embodiment of the inventive concept includes a first memory cell MC1 and a second memory cell MC2 provided between a plurality of conductive lines 101 to 103. As illustrated in FIGS. 4A and 4B, a first memory cell MC1 and a second memory cell MC2 may have different orientations to each other when the first conductive line 101 and the second conductive line 102 are a first wordline and a second wordline, respectively. Referring to FIG. 4A, each of the first memory cell MC1 and the second memory cell MC2 may have a first orientation. Referring to FIG. 4B, the first memory cell MC1 may have a first orientation, and the second memory cell MC2 may have a second orientation.

Figure 5A:
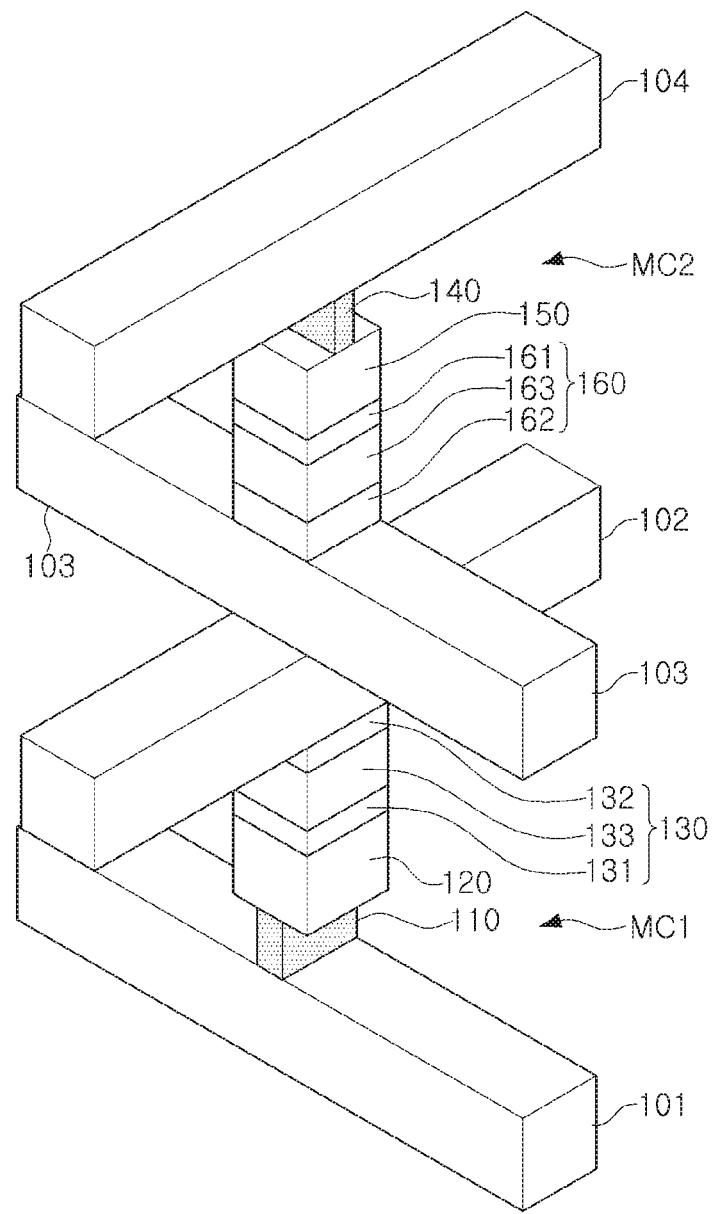
FIGS. 5A and 5B illustrate a structure of a memory cell included in a memory device according to an exemplary embodiment of the inventive concept.
Figure 5B:
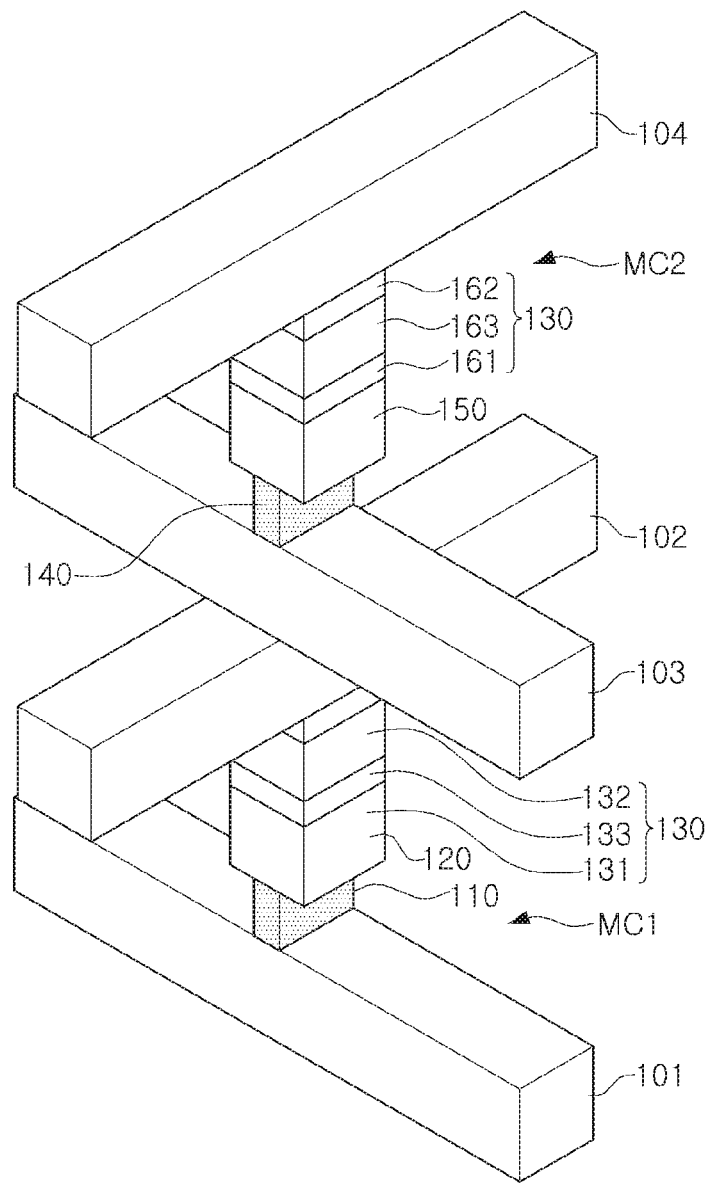

FIGS. 5A and 5B illustrate a structure of a memory cell included in a memory device according to an exemplary embodiment of the inventive concept.

Structures and features of a first memory cell MC1 and a second memory cell MC2 in FIGS. 5A and 5B may be similar to the structures and the features of the first memory cell MC1 and the second memory cell MC2 in FIGS. 4A and 4B, respectively. However, as illustrated in FIGS. 5A and 5B, the first memory cell MC1, connected to a first wordline formed on a first layer, and a second memory cell MC2, connected to a second wordline formed on a second layer, do not share a bitline with each other.

Referring to FIG. 5A, the first memory cell MC1 is provided at an intersection of the first wordline 101, formed on the first layer, and the first bitline 102 formed on the first layer crossing each other. The second memory cell MC2 may be provided at an intersection of the second wordline 103, formed on the second layer, and the second bitline 104 formed on the second layer. The first memory cell MC1 has a first orientation, and the second memory cell MC2 has a second orientation.

The description will be made with reference to FIG. 5B while focusing on differences from FIG. 5A. Referring to FIG. 5B, each of a first memory cell MC1 and a second memory cell MC2 have a first orientation.

Figure 6:
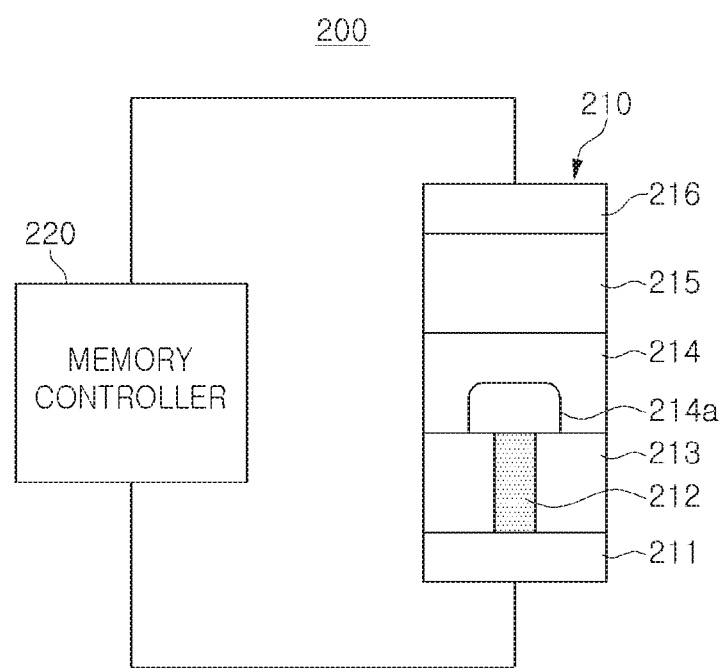
FIG. 6 illustrates an operation of a memory device according to an exemplary embodiment of the inventive concept.

FIG. 6 illustrates an operation of a memory device according to an exemplary embodiment of the inventive concept.

A memory device 200 according to an exemplary embodiment operates using power supplied to a memory cell 210 from a memory controller 220. Referring to FIG. 6, the memory cell 210 includes a lower electrode 211, a heating electrode 212, a data storage element 214, a switching element 215, and an upper electrode 216. The lower electrode 211 and the upper electrode 216 may receive a voltage output through a wordline or a bitline from the memory controller 220. An insulating layer 213 may be provided around the heating electrode 212. In a region 214a of the data storage element 214 adjacent to the heating electrode 212, a phase change may occur due to the power supplied by the memory controller 220. The memory controller 20 of FIG. 2 may be used to implement the memory controller 220 of FIG. 6.

In an exemplary embodiment, a predetermined bias voltage is input to each of the lower and upper electrodes 211 and 216 during a program operation to write data to the memory cell 210. Since the bias voltage is higher than a threshold voltage of an ovonic threshold switching material included in the switching element 215, the memory cell 210 is turned on. Then, a program operation may be performed on the memory cell 210. The phase change material, included in the data storage element 214, may change from an amorphous phase to a crystalline phase due to the program operation. Accordingly, data may be written into a memory area of the memory cell 210.

Figure 7:
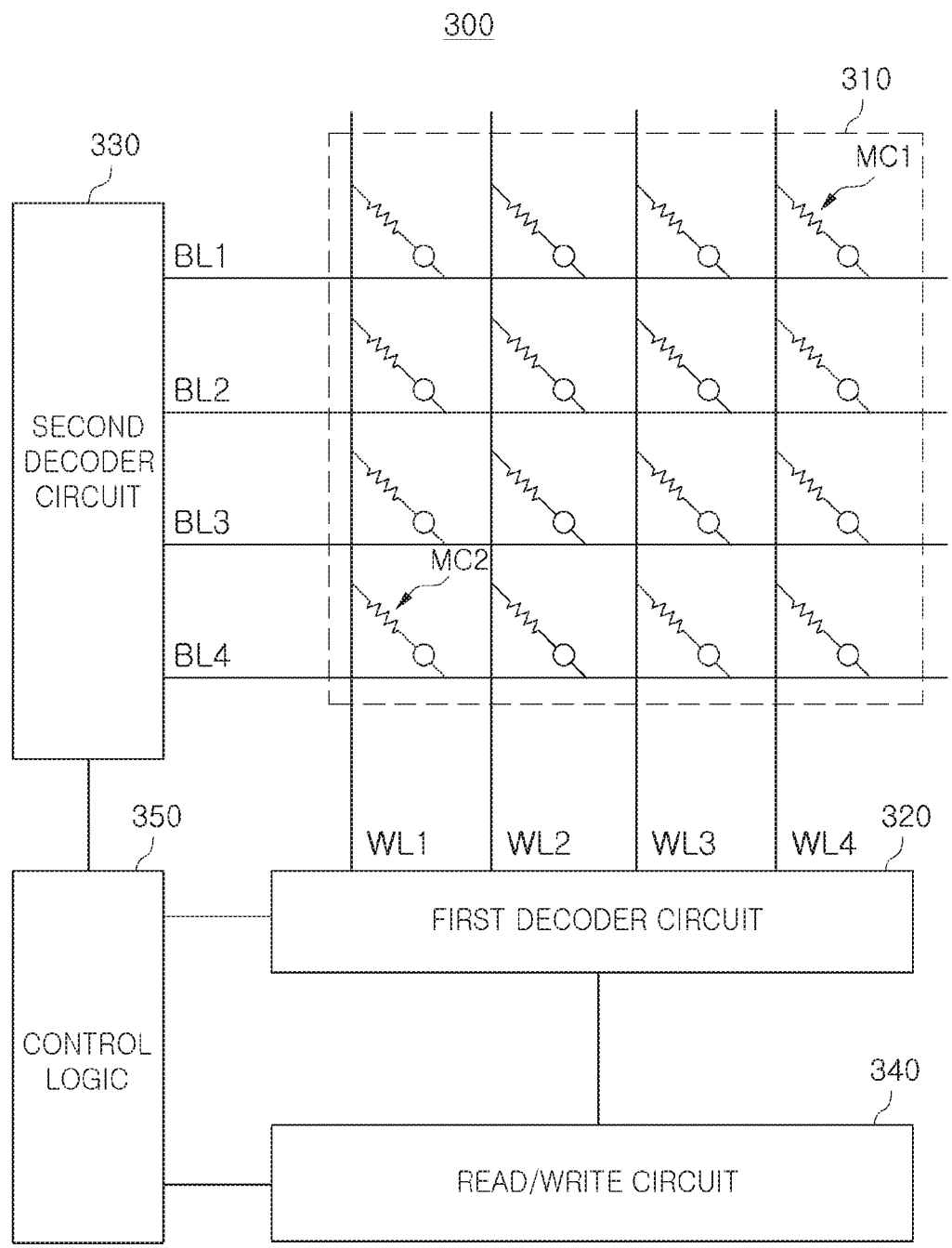
FIG. 7 illustrates a program operation of a memory device according to an exemplary embodiment of the inventive concept.

FIG. 7 illustrates a program operation of a memory device according to an exemplary embodiment of the inventive concept. Referring to FIG. 7, a memory device 300 includes a memory cell array 310, a first decoder circuit 320, a second decoder circuit 330, a read/write circuit 340, and control logic 350. The memory cell array 310 includes first to fourth bitlines BL1 to BL4, first to fourth wordlines WL1 to WL4, and a plurality of memory cells MC. The memory cell array 310 may include additional bitlines and wordlines and is illustrated as having four bitlines and wordlines merely for ease of discussion. The plurality of memory cells MC may be provided at intersections of the first to fourth bitlines BL to BL4 and the first to fourth wordlines WL1 to WL4.

The plurality of memory cells MC, included in the memory cell array 310, may have different current paths from each other. The current path may refer to a distance between the decoder circuits 320 and 330 and a given memory cell MC. A memory cell having an elongated current path may have a path resistance relatively higher than path resistance of a memory cell having a short current path. In contrast, a memory cell having a short current path may have a path resistance relatively lower than the path resistance of the memory cell having an elongated current path. The path resistance may have bitline resistance, wordline resistance, and switching resistance, present in the wordline and the bitline.

The memory cell array 310 may include a first memory cell MC1 and a second memory cell MC2. The first memory cell MC1 is a memory cell farthest distant from the first decoder circuit 320 and the second decoder circuit 330. The second memory cell MC2 is a memory cell closest to the first decoder circuit 320 and the second decoder circuit 330. The first memory cell MC1, farthest distant from the first decoder circuit 320 and the second decoder circuit 330, may have a highest path resistance, and the second memory cell MC2, closest to the first decoder circuit 320 and the second decoder circuit 330, may have a lowest path resistance.

The plurality of memory cells, included in the memory cell array 310, may have different levels of resistance, irrespective of a current path. For example, levels of resistance of the memory cells may be classified as low resistance, intermediate resistance, and high resistance depending on magnitudes thereof.

The first decoder circuit 320 and the second decoder circuit 330 may select a memory cell to be programmed from, among memory cells in response to an address, in a program operation. The memory cell to be programmed by the memory device 300 may be referred to as a selected memory cell. A wordline and a bitline, connected to the selected memory cell, may be referred to as a selected wordline and a selected bitline, respectively.

When the read/write circuit 340 programs the selected memory cell, a current source connected to the selected wordline may supply a program current to the selected memory cell. The program current may flow from the selected bitline to the selected wordline through the selected memory cell.

The resistance of the memory cell may vary depending on a process or deterioration. When the selected memory cell is programmed, program characteristics may be changed as the resistance of the memory cell varies. For example, depending on the resistance of the selected memory cell, a program operation may not be normally performed or endurance may be reduced, depending on resistance of the selected memory cell.

For example, sufficient Joule heating may be required to change a phase change material, constituting the selected memory cell, from a crystalline phase to an amorphous phase. However, when a program operation is performed on the selected memory cell, Joule heating may not reach a target melting point of the selected memory cell due to the difference between the resistance of the selected memory cell and a path resistance. Accordingly, the distribution of the selected memory cells may be broadened.

In an one embodiment, program current having the same magnitude is supplied to memory cells having different program characteristics from each other.

Figure 8A:
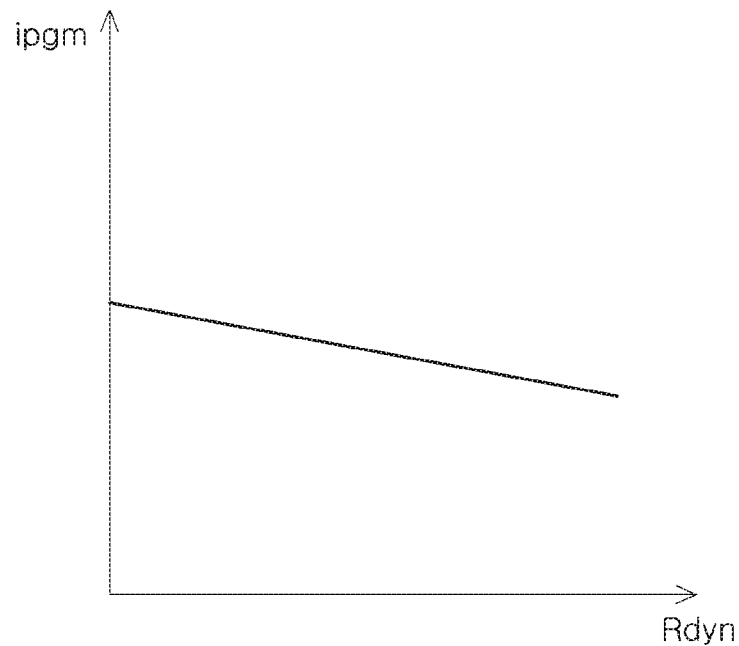
FIG. 8A illustrates the amount of change in program current depending on resistance of a memory cell according to an exemplary embodiment of the inventive concept.
Figure 8B:
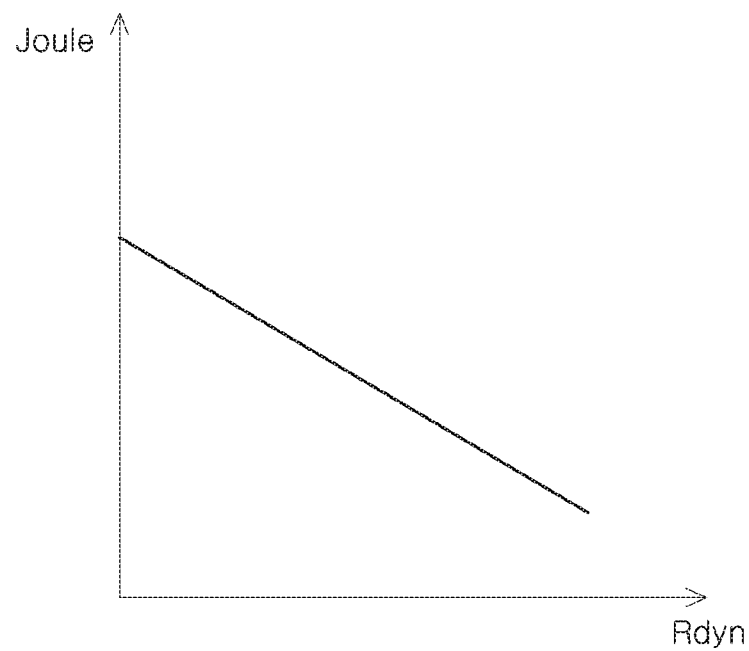
FIG. 8B illustrates Joule heating depending on resistance of a memory cell according to an exemplary embodiment of the inventive concept.

FIG. 8A illustrates the amount of change in program current depending on resistance of a memory cell according to an exemplary embodiment, and FIG. 8B illustrates Joule heating depending on resistance of a memory cell according to an exemplary embodiment.

A selected memory cell receives a program current from a current source connected to a selected wordline. However, even when a constant magnitude of program current is supplied to the selected memory cell, the program current (e.g., ipgm) flowing through the selected memory cell may be decreased as resistance (e.g., Rdyn) of the selected memory cell is increased, as illustrated in FIG. 8A. In addition, Joule heating generated in the selected memory cell may be reduced as the resistance of the selected memory cell is increased Returning to FIG. 7, when the memory device 300 according to an exemplary embodiment programs a selected memory cell of the memory cell array 310, and program current for the programming of the selected memory cell is determined depending on a resistance of the selected memory cell. The determined program current may be supplied to the selected memory cell. Thus, the memory device 300 may compensate for a change in program characteristics depending on the resistance of the selected memory cell during the program operation.

Figure 9A:
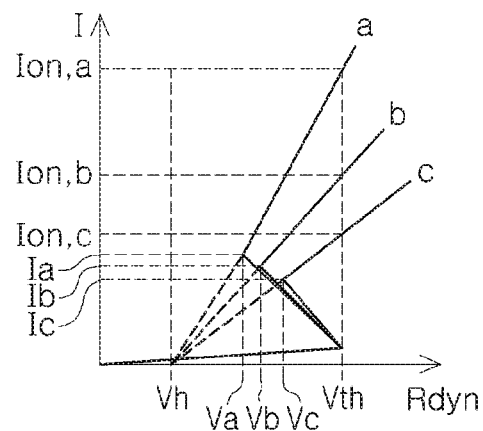
FIG. 9A illustrates a voltage-current graph of a memory cell in a program operation of a memory device according to an exemplary embodiment of the inventive concept.
Figure 9B:
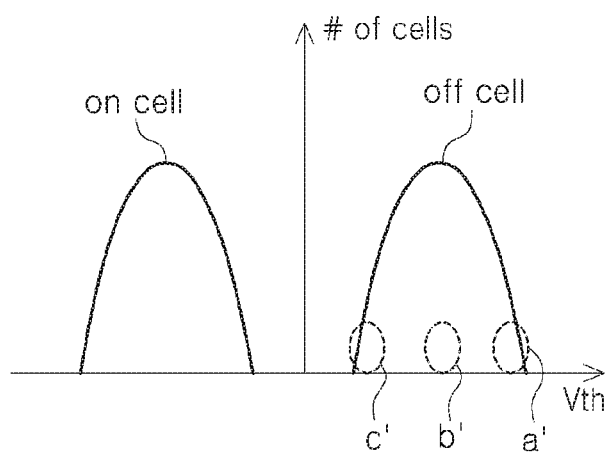
FIG. 9B illustrates a distribution of memory cells depending on resistance of a memory cell according an exemplary embodiment of the inventive concept.

FIG. 9A illustrates a voltage-current graph of a memory cell during a program operation of a memory device according to an exemplary embodiment, and FIG. 9B illustrates a distribution of memory cells depending on a resistance of a memory cell according an exemplary embodiment. For example, FIG. 9B illustrates a distribution of on cells and off cells among the memory cells based on resistances of the memory cells.

Referring to FIG. 9A, as a bias voltage is supplied to a selected wordline and a selected bitline, a voltage across the selected memory cell is increased to a threshold voltage Vth. Thus, the selected memory cell is turned on.

In an exemplar embodiment, a holding current is supplied to the selected memory cell to prevent the selected memory cell from turning off after the selected memory cell is turned on. The holding current may refer to a minimum current required to prevent a selected memory cell CELL from being turned off. In this case, the voltage across the selected memory cell CELL may be referred to as a holding voltage. When the voltage across the selected memory cell is lower than the holding voltage, the select memory cell is turned off.

However, the holding current, flowing to the selected memory cell, may vary depending on the resistance of the selected memory cell. For example, when the resistance of the selected memory cell is a low resistance (a), a first holding current Ia flows through the selected memory cell, and the voltage across the selected memory cell is a first holding voltage Va. When the resistance of the selected memory cell is an intermediate resistance (b), a second holding current Ib flows through the selected memory cell, and the voltage across the selected memory cell is a second holding voltage Vb. When the resistance of the selected memory cell is a high resistance (c), a third holding current Ic flows through the selected memory cell, and the voltage across the selected memory cell is a third holding voltage Vc.

The second holding current Ib is lower than the first holding current Ia and higher than the third holding current Ic. The second holding voltage Vb is higher than the first holding voltage Va and lower than the third holding voltage Vc. For example, the holding voltage across the selected memory cell may be changed depending on the resistance of the selected memory cell. For example, the lower the resistance of the selected memory cell, the lower the holding voltage across the selected memory cell, and the higher the resistance of the selected memory cell, the higher the holding voltage across the selected memory cell.

According to an exemplary embodiment, when a selected memory cell is programmed, a holding voltage of the selected memory cell is detected to detect resistance of the selected memory cell. In addition, program current may be determined depending on the detected resistance of the selected memory cell, and the determined program current may be supplied to the selected memory cell. Thus, the memory device of the present disclosure may compensate for a change in program characteristics depending on the resistance of the selected memory cell.

Referring to FIGS. 9A and 9B, the distribution of memory cells may be changed depending on whether the resistance of the selected memory cell is a low resistance (a), an intermediate resistance (b), or a high resistance (c). For example, in the case of an off-cell, when the resistance of the selected memory cell is the low resistance (a), the selected memory cell may be distributed in a region a'. When the resistance of the selected memory cell is the intermediate resistance (b), the selected memory cell may be distributed in a region b'. When the resistance of the selected memory cell is the high resistance (c), the selected memory cell may be distributed in a region c'. In an exemplary embodiment, the threshold voltage Vth of a selected memory cell having the intermediate resistance (b) is higher than the threshold voltage Vth of a second memory cell having the low resistance (a) and lower than the threshold voltage Vth of a selected memory cell having the high resistance (c).

As described with reference to FIGS. 8A and 8B, the program current flowing through a selected memory cell is increased as the resistance of the selected memory cell is decreased, so that excessive heat may be generated in the selected memory cell. Therefore, the selected memory cell may be distributed in the region a' as the resistance of the selected memory cell is decreased.

In contrast, the program current flowing through the selected memory cell is decreased as the resistance of the selected memory cell is increased, so that sufficient Joule heating may not be generated in the selected memory cell. Therefore, the selected memory cell may be distributed in the region c' as the resistance of the selected memory cell is increased.

As a result, the distribution of the selected memory cell may be broadened depending on the resistance of the selected memory cell during a program operation.

Figure 10:
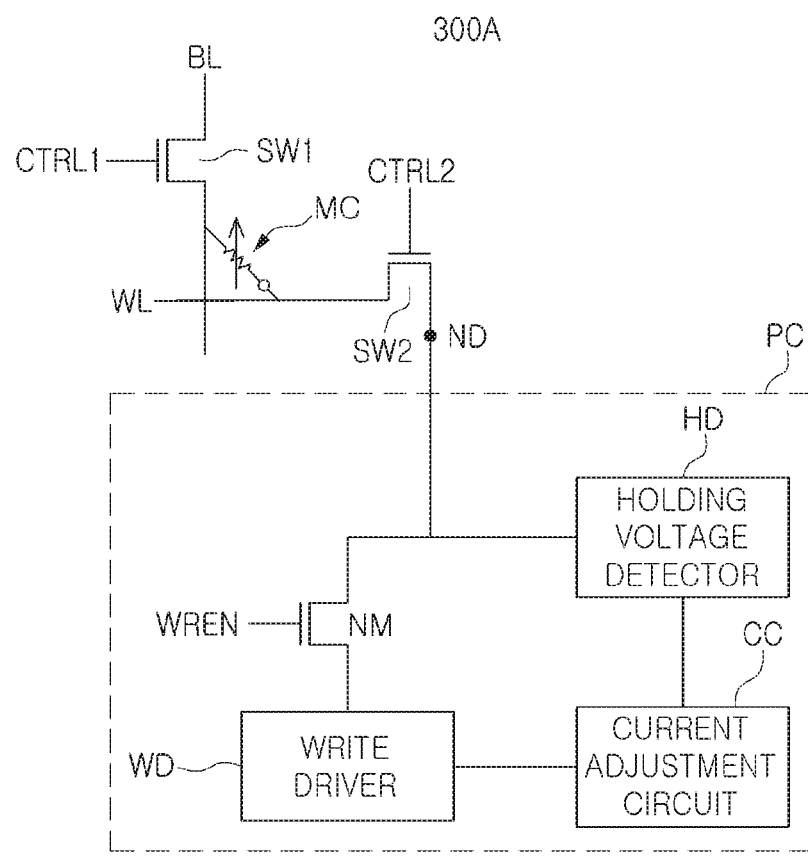
FIG. 10 illustrates a memory device according to a memory device according to an exemplary embodiment of the inventive concept.

FIG. 10 illustrates a memory device according to a memory device according to an exemplary embodiment of the inventive concept.

Referring to FIG. 10, a memory device 300A include a memory cell MC, a first switch SW1 (e.g., a transistor), a second switch SW2 (e.g., a transistor)), a node ND, an NMOS transistor NM, a write driver WD (e.g., a driver circuit), a holding voltage detector HD (e.g., a voltage detection circuit), and a current adjustment circuit CC.

The NMOS transistor NM, the write driver WD, the holding voltage detector HD, and the current adjustment circuit CC may be included in a programming circuit PC. The programming circuit PC may be disposed below a memory cell array including a memory cell MC. The programming circuit PC may be connected to a wordline WL of the memory cell MC through the node ND. When the wordline WL is a selected wordline, a voltage across the node ND may refer to a voltage of the selected wordline.

The first switch SW1 may control turning ON/OFF of a bitline BL in response to a first control signal CTRL1, and the second switch SW2 may control turning ON/OFF of a wordline WL in response to a second control signal CTRL2. The NMOS transistor NM may be turned on in response to a program enable signal WREN when a selected memory cell MC is programmed.

According to an exemplary embodiment, the holding voltage detector HD detects a holding voltage of a selected memory cell MC to detect a resistance of the selected memory cell MC. The current adjustment circuit CC may determine an additional program current depending on the detected resistance. The write driver WD may perform an ultimate program operation based on the additional program current, and may perform the ultimate program operation on the selected memory cell MC. Thus, the memory device 300A may prevent the distribution of the selected memory cell MC from being broadened during the program operation.

Hereinafter, a memory device according to an exemplary embodiment of the inventive concept will be described in detail with reference to FIGS. 11 to 20.

Figure 11A:
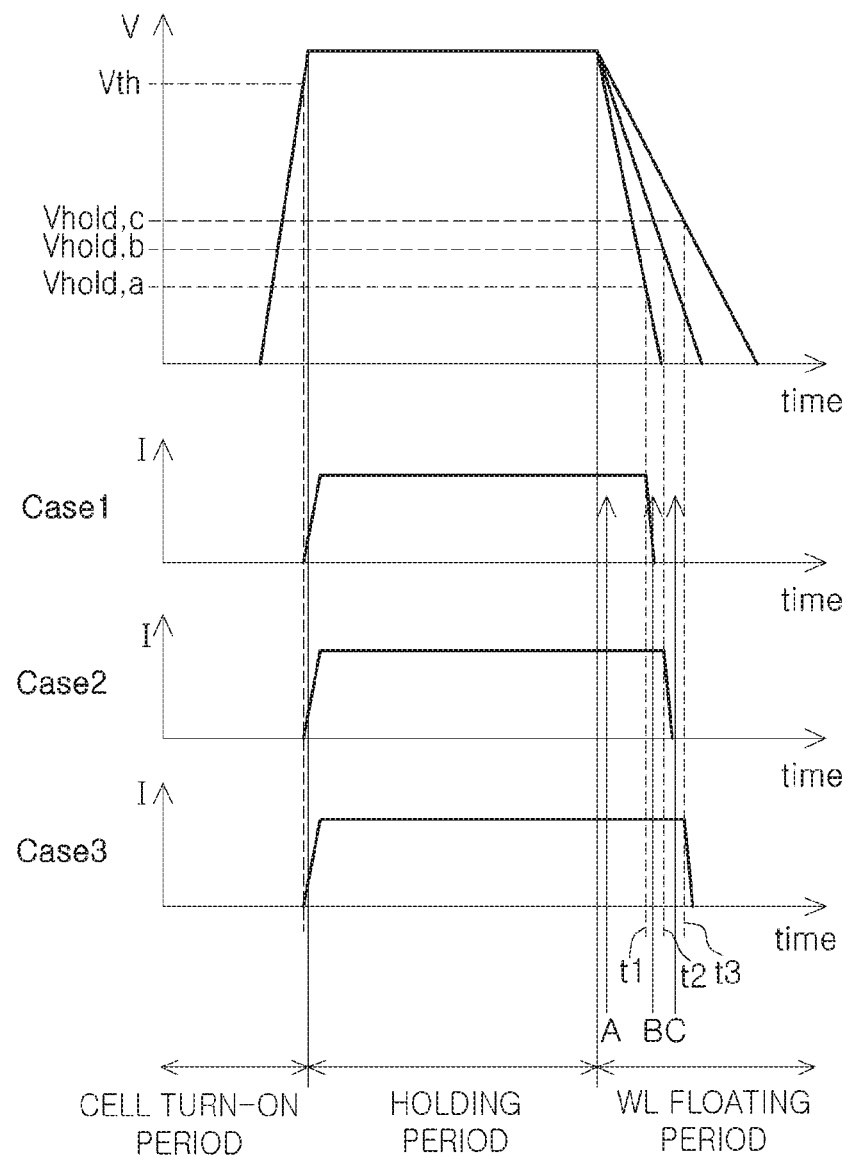
FIG. 11A illustrates a program operation of a memory device according to an exemplary embodiment of the inventive concept.
Figure 11B:
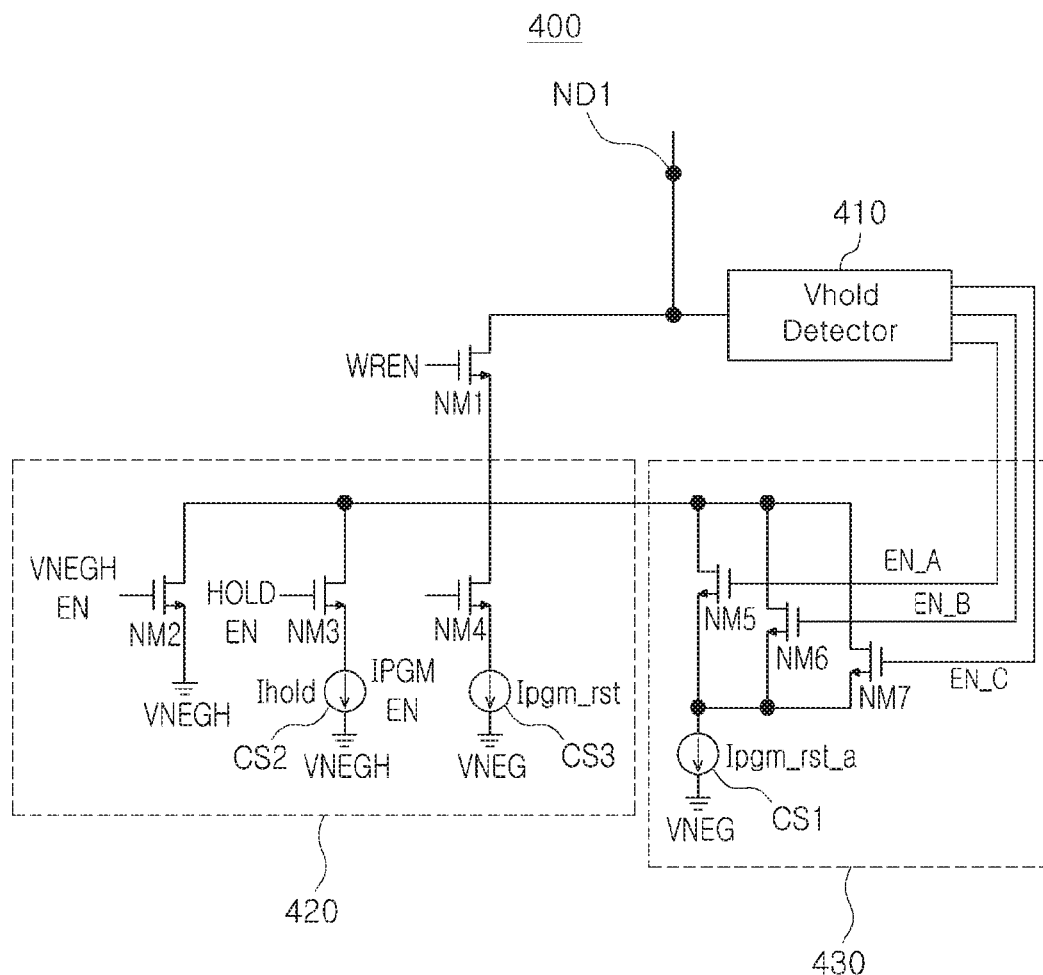
FIG. 11B is a circuit diagram of a memory device according to an exemplary embodiment of the inventive concept.
Figure 11C:
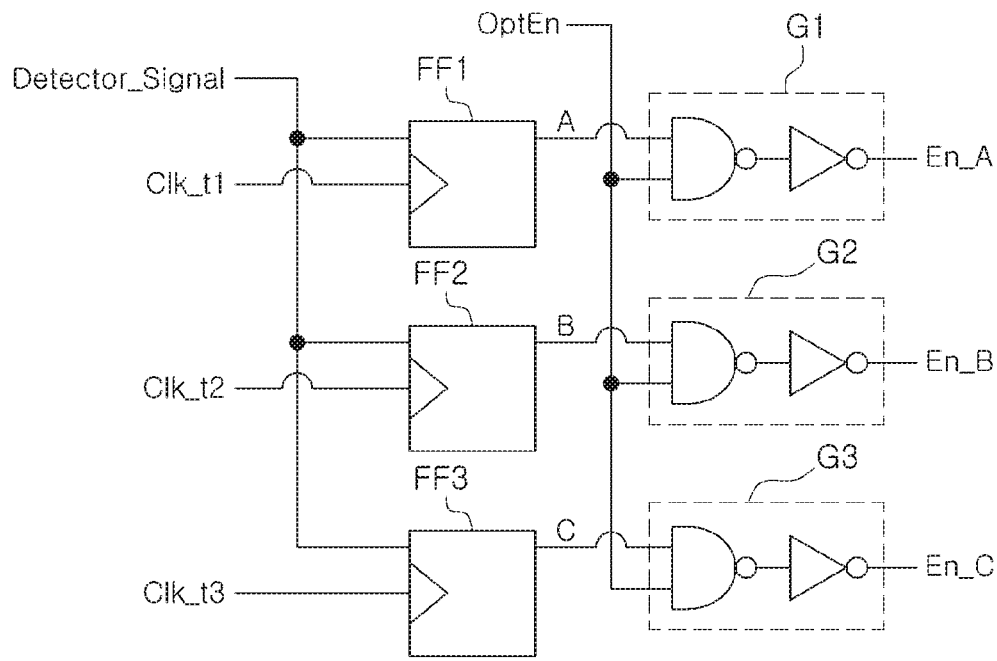
FIG. 11C is a circuit diagram of a holding voltage detector in FIG. 11B.
Figure 11D:
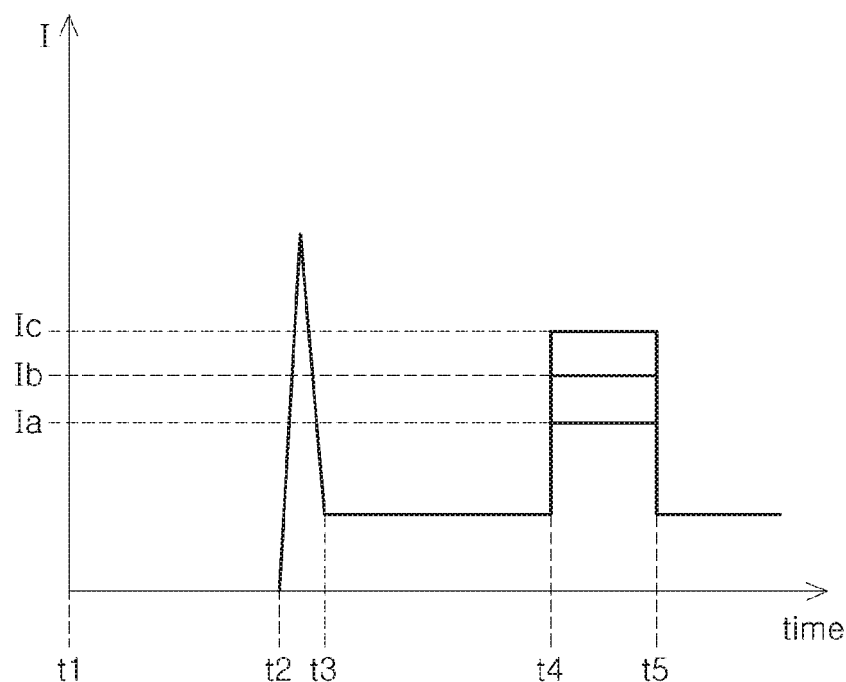
FIG. 11D illustrates a program operation of a memory device according to an exemplary embodiment of the inventive concept.

FIG. 11A illustrates a program operation of a memory device according to an exemplary embodiment, FIG. 11B is a circuit diagram of a memory device according to an exemplary embodiment, FIG. 11C is a circuit diagram of a holding voltage detector in FIG. 11B, and FIG. 11D illustrates a program operation of a memory device according to an exemplary embodiment. FIGS. 11A to 11D illustrate an embodiment in which a holding voltage of a selected memory cell is detected in a digital manner.

FIG. 11A illustrates an embodiment in which a memory device detects a resistance of a selected memory cell during a pre-reading period. Referring to FIG. 11A, the pre-reading period includes a cell turn-on period, a holding period, and a wordline floating period. As a bias voltage is supplied to a selected wordline and a selected bitline in the cell turn-on period, a voltage across the selected memory cell is increased to a threshold voltage Vth. Thus, the selected memory cell is turned on.

In an exemplary embodiment, a holding current is supplied to the selected memory cell to prevent the selected memory cell from being turned off in the holding period following the cell turn-on period. In an exemplary embodiment, a current source is connected to a selected wordline to supply the holding current to the selected memory cell.

In an exemplary embodiment, a selected wordline switch connected to the selected wordline is turned off during the wordline floating period following the holding period. Accordingly, the selected wordline is in a floating state during the wordline floating period. Holding voltages Vhold,a, Vhold,b, and Vhold,c of the selected memory cell may be detected and a resistance of the selected memory cell may be detected during the wordline floating period Specifically, when the selected wordline is in the floating state, electric charges precharged in a wordline may be discharged. When the electric charges precharged in the wordline are discharged, a voltage across the selected memory cell may be decreased. When the voltage across the selected memory cell is decreased to be lower than the holding voltages Vhold,a, Vhold,b, Vhold,c, the selected memory cell is turned off.

Points in time, at which the selected memory cells are turned off, may be different from each other depending on levels of resistance of the selected memory cells. For example, in the case in which the resistance of the selected memory cell is a low resistance (Case1), the holding voltage of the selected memory cell is the first holding voltage Vhold,a and the selected memory cell is turned off at a first point in time t1. In the case in which the resistance of the selected memory cell is an intermediate resistance (Case2), the holding voltage of the selected memory cell is the second holding voltage Vhold,b and the selected memory cell is turned off at a second point in time t2. When the resistance of the selected memory cell is a high resistance (Case3), the holding voltage of the selected memory cell is the third holding voltage Vhold,c and the selected memory cell is turned off at a third point in time t3. In an exemplary embodiment, the first point in time t1 leads the second point in time t2, and the third point in time t3 lags behind the second point in time t2.

For example, the holding voltage of the selected memory cell may be detected by detecting a point in time at which the selected memory cell is turned off. Since the resistance of the selected memory cell may be detected when the holding voltage is detected, the resistance of the selected memory cell may be detected by detecting a point in time at which the selected memory cell is turned off.

Referring to FIG. 11B, a memory device 400 includes a first node ND1, a first NMOS transistor NM1, a holding voltage detector 410, a write driver 420, and a current adjustment circuit 430. The first NMOS transistor NM1, the holding voltage detector 410, the write driver 420, and the current adjustment circuit 430 may be included in a programming circuit. The programming circuit may be disposed below the memory cell array. The programming circuit may be connected to a wordline of a memory cell array through the first node ND1. When the wordline is a selected wordline, a voltage across the first node ND1 may refer to a voltage of the selected wordline.

In a program operation for a selected memory cell, the memory device 400 may operate while an operating mode thereof is divided into a first mode and a second mode. In an exemplary embodiment, when the memory device 400 operates in the first mode, the memory device 400 adjusts the magnitude of the program current depending on a resistance of the selected memory cell. In an exemplary embodiment, when the memory device 400 operates in the second mode, the memory device 400 does not adjust the magnitude of the program current depending on the resistance of the selected memory cell. When the memory device 400 operates in the first mode, the program operation for the selected memory cell includes a pre-reading period, a cell turn-on period, a holding period, and a programming period.

FIG. 11C illustrates an exemplary embodiment in which the holding voltage detector 410 detects a resistance of a selected memory cell in a pre-reading period. Referring to FIG. 11C, the holding voltage detector 410 only operates in the first mode. When the memory device 400 operates in the first mode, an option enable signal OptEn may be a signal having logic '1'. When the memory device 400 operates in the second mode, the option enable signal OptEn may be a signal having logic '0'.

The holding voltage detector 410 includes first to third flip-flops FF1 to FF3 and first to third AND gates G1 to G3 (e.g., gate circuits, logic gates, or logic circuits). For example, an AND gate may be implemented by a NAND gate and an inverter. Each of the first to third flip-flops FF1 to FF3 receive a detector signal Detector_signal. The detector signal Detector_signal may be a voltage of the selected wordline (for example, the voltage across the first node ND1 in FIG. 10B).

The first flip-flop FF1 outputs the detector signal Detector_signal in response to a first clock signal Clk_t1. An output of the first flip-flop FF1 may be a voltage of the selected wordline at a point in time A in FIG. 11A. In FIG. 11A, the current may always flow to the selected wordline irrespective of whether the resistance of the selected memory cell is a low resistance, an intermediate resistance, or a high resistance (Case1, Case2, and Case3). Accordingly, the output of the first flip-flop FF1 may be logic '1' irrespective of whether the resistance of the selected memory cell is a low resistance, an intermediate resistance, or a high resistance.

A first AND gate G1 receives an output signal of the first flip-flop FF1 and the option enable signal OptEn, and outputs a first control signal En_A. When the output of the first flip-flop FF1 is logic '1', the first control signal En_A is logic '1'. Accordingly, the output En_A of the first AND gate G1 may be logic '1' irrespective of whether the resistance of the selected memory cell is a low resistance, an intermediate resistance, or a high resistance.

The second flip-flop FF2 outputs the detector signal Detector_signal in response to a second clock signal Clk_t2. The output of the second flip-flop FF2 may be a voltage of a selected wordline at a point in time B in FIG. 10A. In FIG. 11A, when the resistance of the selected memory cell is a low resistance, current does not flow to the selected wordline (Case1). When the resistance of the selected memory cell is an intermediate or high resistance, current may flow to the selected wordline (Case2 and Case3). Accordingly, the output of the second flip-flop FF2 may be logic '0' when the resistance of the selected memory cell is low resistance, and may be logic '1' when the resistance of the selected memory cell is intermediate or high resistance.

A second AND gate G2 receives an output signal of the second flip-flop FF2 and an option enable signal OptEn, and outputs a second control signal En_B. When the output of the second flip-flop FF2 is logic '0', the second control signal En_B is logic '0'. Accordingly, when the resistance of the selected memory cell is a low resistance, the output En_B of the second AND gate G2 is logic '0'. When the output of the second flip-flop FF2 is logic '1', the second control signal En_B is logic '1'. Accordingly, when the resistance of the selected memory cell is intermediate or high resistance, the output En_B of the second AND gate G2 is logic '1'.

The third flip-flop FF3 outputs the detector signal Detector_signal in response to a third clock signal Clk_t3. The output of the third flip-flop FF3 may be a voltage of the selected wordline at a point in time C in FIG. 11A. In FIG. 11A, when the resistance of the selected memory cell is low or intermediate resistance, no current flows to the selected wordline (Case1 and Case2). When the resistance of the selected memory cell is high resistance, current flow to the selected wordline (Case3). Accordingly, the output of the third flip-flop FF3 is logic '0' when the resistance of the selected memory cell is a low or medium resistance, and is logic '1' when the resistance of the selected memory cell is high resistance.

A third AND gate G3 receives an output signal of the third flip-flop FF3 and an option enable signal OptEn, and outputs a third control signal En_C. When the output of the third flip-flop FF3 is logic '0', the third control signal En_C is logic '0'. Accordingly, when the resistance of the selected memory cell is low or intermediate resistance, the output En_C of the third AND gate G3 is logic '0'. When the output of the third flip-flop FF3 is logic '1', the third control signal En_C is logic '1'. Accordingly, when the resistance of the selected memory cell is high resistance, the output En_C of the third AND gate G3 is logic '1'.

Logical values of the control signals En_A, En_B, and En_C depending on the resistance of the selected memory cell are shown in Table 1.

TABLE 1

|  | First Control Signal (En_A) | Second Control Signal (En_B) | Third Control Signal (En_C) |
| --- | --- | --- | --- |
| Low Resistance | 1 | 0 | 0 |
| Intermediate Resistance | 1 | 1 | 0 |
| High Resistance | 1 | 1 | 1 |

Returning to FIG. 11B, operations of the memory device 400 during the cell turn-on period, the holding period, and the programming period following the pre-reading period will be described. The write driver 420 includes second to fourth NMOS transistors NM2 to NM4, a second current source CS2, and a third current source CS3. In the cell turn-on period, the first NMOS transistor NM1 is turned on in response to a program enable signal WREN, and the second NMOS transistor NM2 is turned on in response to a bias voltage enable signal VNEGH EN. Since the first NMOS transistor NM1 and the second NMOS transistor NM2 are turned on, a bias voltage is supplied to a selected wordline and a selected bitline. As the decoder circuit supplies the bias voltage to the selected wordline and the selected bitline, the voltage across the select memory cell is increased to a threshold voltage. Thus, the selected memory cell is turned on.

A decoder circuit of the memory device 400 may include a bias circuit and a selection circuit. The selection circuit may select a memory cell to be programmed, and the bias circuit may supply a bias voltage to a selected wordline and a selected bitline, connected to the selected memory cell, to turn on the selected memory cell.

In an exemplary embodiment, a holding current is supplied to the selected memory cell to prevent the selected memory cell from being turned off during a holding period following the cell turn-on period. To supply the holding current to the selected memory cell, the second NMOS transistor NM2 is turned off in response to a bias voltage enable signal VNEGH EN and the third NMOS transistor NM3 is turned on in response to a holding enable signal HOLD EN. As the third NMOS transistor NM3 is turned on, the second current source CS2 is connected to the selected memory cell. Accordingly, a holding current Ihold may be supplied to the selected memory cell.

In the programming period following the holding period, an initial program current Ipgm_rst is supplied to a selected wordline connected to the selected memory cell. The third NMOS transistor NM3 is turned off in response to the holding enable signal HOLD EN to supply the initial program current Ipgm_rst to the selected wordline connected to the selected memory cell, and the fourth NMOS transistor NM4 is turned on in response to a program enable signal IPGM EN. As the fourth NMOS transistor NM4 is turned on, a third current source CS3 is connected to the selected wordline. Accordingly, the initial program current Ipgm_rst is supplied to the selected memory cell.

In an exemplary embodiment, a second power supply voltage VNEG has a level lower than a level of the first power supply voltage VNEGH. Accordingly, a difference between voltages applied to both ends of the selected memory cell CELL in the programming period may be greater than a difference between voltages applied to both ends of the selected memory cell CELL in the cell turn-on period and the holding period.

A current adjustment circuit 430 includes fifth to seventh NMOS transistors NM5 to NM7 and a first current source CS1. The fifth NMOS transistor NM5 is turned on in response to a first control signal En_A, the sixth NMOS transistor NM6 is turned on in response to a second control signal En_B, and the seventh NMOS transistor NM7 is turned on in response to a third control signal En_C. Current drivabilities of the fifth to seventh NMOS transistors NM5 to NM7 may be different from each other.

As described with reference to FIG. 11C, when the resistance of the selected memory cell is a low resistance, the first control signal En_A is logic '1' and the second control signal En_B and the third control signal En_C are logic '0'. In response to the first to third control signals En_A to En_C, the fifth NMOS transistor NM5 is turned on and the sixth NMOS transistor NM6 and the seventh NMOS transistor NM7 are turned off. Thus, an additional program current Ipgm_rst_a, flowing to the selected memory cell due to the first current source CS1, has a first magnitude.

When the resistance of the selected memory cell is an intermediate resistance, the first control signal En_A and the second control signal En_B are logic '1', and the third control signal En_C is a logic '0'. In response to the first to third control signals En_A to En_C, the fifth NMOS transistor NM5 and the sixth NMOS transistor NM6 are turned on and the seventh NMOS transistor NM7 is turned off. Thus, the additional program current Ipgm_rst_a, flowing to the selected memory cell due to the first current source CS1, has a second magnitude.

When the resistance of the selected memory cell is a high resistance, the first control signal En_A, the second control signal En_B, and the third control signal En_C are logic '1'. The fifth NMOS transistor NM5, the sixth NMOS transistor NM6, and the seventh NMOS transistor NM7 are turned on in response to the first to third control signals En_A to En_C. Thus, the additional program current Ipgm_rst_a, flowing to the selected memory cell due to the first current source CS1, has a third magnitude.

The first magnitude, the second magnitude, and the third magnitude may be different from each other depending on the current drivability of each of the fifth to seventh NMOS transistors NM5 to NM7. For example, the higher the resistance of the selected memory cell, the greater the magnitude of the additional program current Ipgm_rst_a supplied to the selected memory cell.

A final program current, supplied to the selected memory cell, may correspond to the sum of the initial program current Ipgm_rst and the additional program current Ipgm_rst_a. Since the magnitude of the additional program current Ipgm_rst_a, supplied to the selected memory cell, may be increased as the resistance of the selected memory cell is increased, the final program current supplied to the selected memory cell may be increased as the resistance of the selected memory cell is increased.

Referring to FIG. 11D, the magnitude of the additional program current depending on the resistance of the selected memory cell may be determined by detecting a point time at which the selected memory cell is turned off during pre-reading periods t1 to t2. As a voltage across the selected memory cell be increased to the threshold voltage during the cell turn-on periods t2 to t3, the selected memory cell is turned on. In holding periods t3 to t4, the holding current is supplied to the selected memory cell.

The final program current may be supplied to the selected memory cell during the programming periods t4 and t5. The final program current may correspond to the sum of the initial program current and the additional program current. The additional program current may have a magnitude determined in the pre-reading periods t1 and t2. For example, the higher the resistance of the selected memory cell, the greater the magnitude of the additional program current. Accordingly, the higher the resistance of the selected memory cell, the higher the final program current supplied to the selected memory cell.

As illustrated in FIG. 11D, when the resistance of the selected memory cell is a low resistance, the final program current supplied to the selected memory cell is Ia. When the resistance of the selected memory cell is an intermediate resistance, the final program current supplied to the selected memory cell is Ib. When the resistance of the selected memory cell is a high resistance, the final program current supplied to the selected memory cell is Ic. In an exemplary embodiment, a magnitude of Ib is greater than a magnitude of Ia and less than a magnitude of Ic.

Figure 12A:
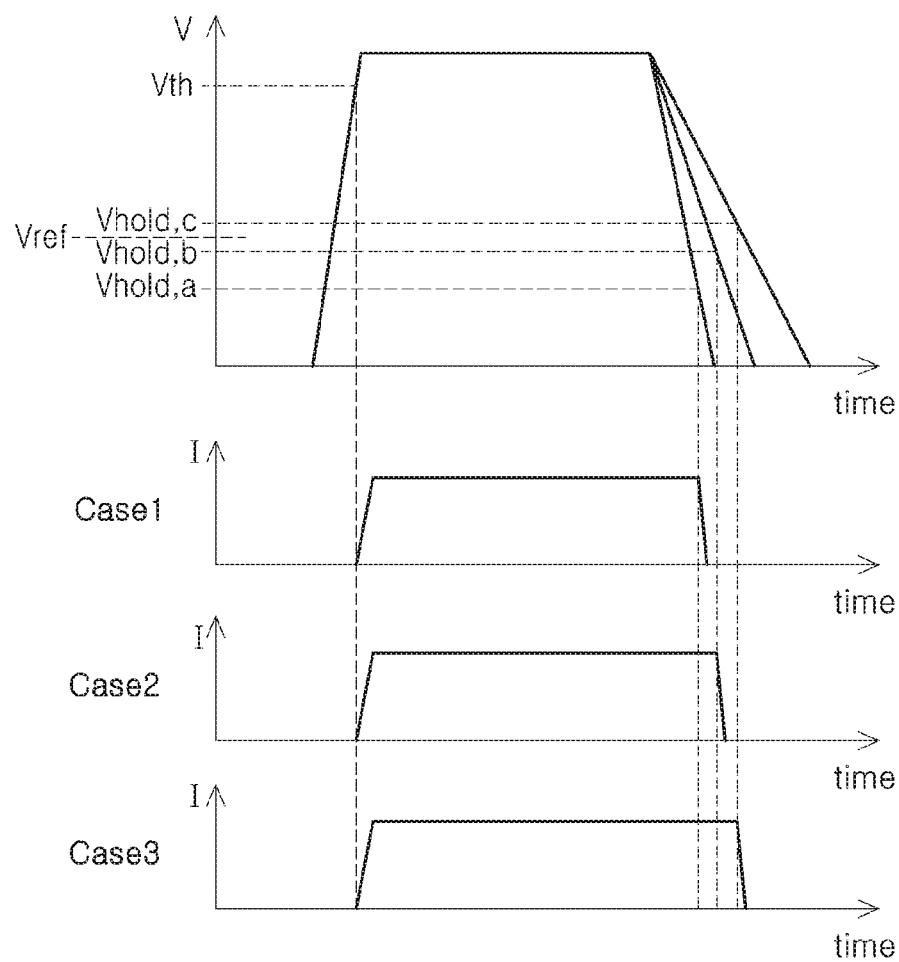
FIGS. 12A and 12B illustrate a program operation of a memory device according to an exemplary embodiment of the inventive concept.
Figure 12B:
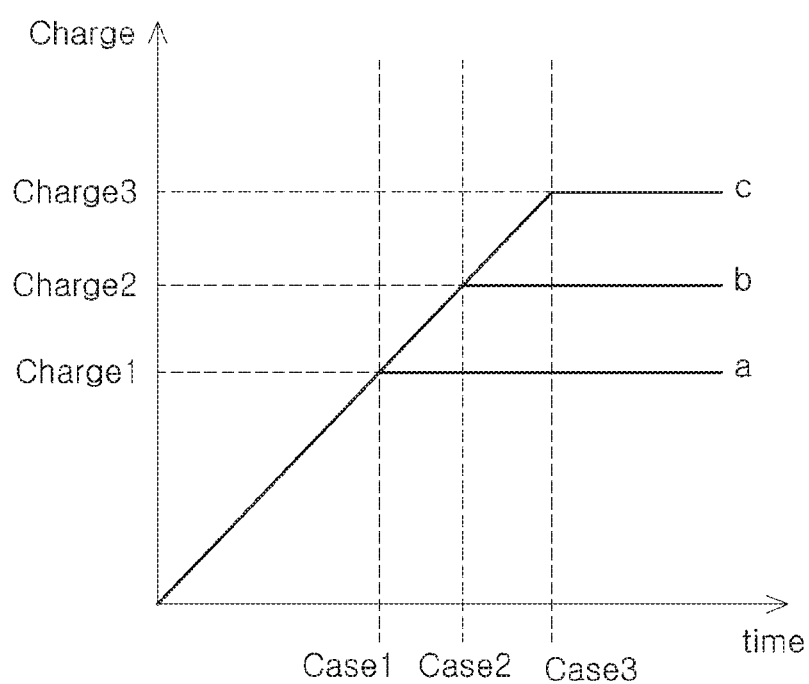
Figure 12C:
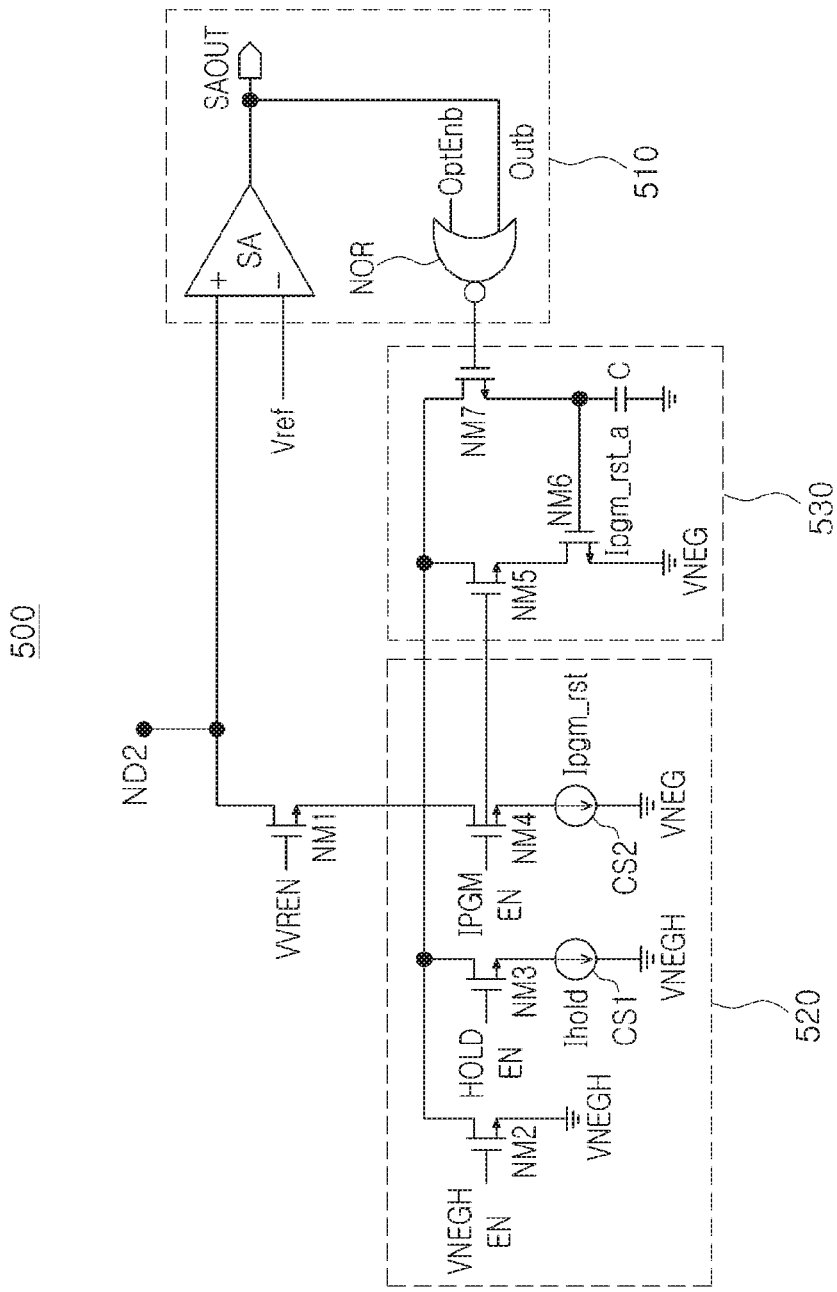
FIG. 12C is a circuit diagram of a memory device according to an exemplary embodiment of the inventive concept.

FIGS. 12A and 12B illustrate a program operation of a memory device according to an exemplary embodiment of the inventive concept, and FIG. 12C is a circuit diagram of a memory device according to an exemplary embodiment of the inventive concept. FIGS. 12A to 12C illustrate an embodiment in which a holding voltage of a selected memory cell is detected in an analog manner.

Referring to FIG. 12A, as a bias voltage is supplied to a selected wordline and a selected bitline during a cell turn-on period, a voltage across the selected memory cell is increased to a threshold voltage Vth. Accordingly, the selected memory cell is turned on.

In an exemplary embodiment, a holding current is supplied to the selected memory cell to prevent the selected memory cell from being turned off during a holding period following the cell turn-on period. In a wordline floating period following the holding period, holding voltages Vhold,a, Vhold,b, and Vhold,c of the selected memory cell may be detected and a resistance of the selected memory cell may be detected.

As a selected wordline switch is turned off in the wordline floating period, a selected wordline may have a floating state. When the selected wordline has a floating state, electric charges precharged in the selected wordline are discharged. When the electric charges precharged in the selected wordline are discharged, the voltage across the selected memory cell is decreased. When the voltage across the selected memory cell is lower than the holding voltages Vhold,a, Vhold,b, and Vhold,c, the selected memory cell is turned off. Until the select memory cell is turned off, the quantity of electric charges output from the select wordline may vary depending on the resistance of the select memory cell.

Referring to FIGS. 12A and 12B, when the resistance of the selected memory cell is a low resistance (a), the quantity of electric charges, output from the selected wordline until the selected memory cell is turned off, is the first charge amount Charge1 (Case1). When the resistance of the selected memory cell is an intermediate resistance (b), the quantity of electric charges, output from the selected wordline until the selected memory cell is turned off, is the second charge amount Charge2 (Case2). When the resistance of the selected memory cell is a high resistance (c), the quantity of electric charges, output from the selected wordline until the selected memory cell is turned off, is the third charge amount Charge3 (Case3).

Since points in times, at which the selected memory cells are turned off, are different from each other depending on levels of resistance of the selected memory cells, the first charge amount Charge1, the second charge amount Charge2, and the third charge amount Charge3 may be different from each other. For example, as the resistance of the selected memory cell is increased, the quantity of electric charges output from the selected wordline may be increased until the selected memory cell is turned off.

Referring to FIGS. 12A to 12C, a memory device 500 includes a second node ND2, a first NMOS transistor NM1, a holding voltage detector 510, a write driver 520, and a current adjustment circuit 530. The first NMOS transistor NM1, the holding voltage detector 510, the write driver 520, and the current adjustment circuit 530 may be included in a programming circuit. The programming circuit may be disposed below a memory cell array. The programming circuit may be connected to a wordline of the memory cell array through the second node ND2. When the wordline is the selected wordline, a voltage across the second node ND2 may refer to a voltage of the selected wordline.

In a pre-reading period, the holding voltage detector 510 detects a resistance of the selected memory cell. The holding voltage detector 510 includes a comparator SA and a NOR gate NOR.

The comparator SA has a first terminal, receiving a voltage of the second node ND2, and a second terminal receiving a reference voltage Vref. The comparator SA may compare the voltage across the second node ND2 with the reference voltage Vref, and may output a result of the comparison as an output signal SAOUT. For example, the comparator SA may output logic '1' when the voltage across the second node ND2 is not the reference voltage Vref, and may output logic '0' when the voltage across the second node ND2 is the reference voltage Vref.

For example, the reference voltage Vref may have a level higher than a level of the first holding voltage Vhold,a and a level of the second holding voltage Vhold,b and lower than a level of the third holding voltage Vhold,c, as illustrated in FIG. 12A.

The NOR gate NOR may receive a complementary signal Outb of an output signal SAOUT of the comparator SA and a complementary signal OptEnb of an option enable signal. The option enable signal may be logic '1' in a first mode. When the complementary signal Outb of the output signal SAOUT of the comparator SA is logic '0' and the complementary signal OptEnb of the option enable signal is logic '0', the NOR gate NOR outputs logic '1'.

For example, in a first mode, the NOR gate NOR outputs logic '1' when the voltage across the second node ND2 is not the reference voltage Vref. Alternatively, in the first mode, the NOR gate NOR outputs logic '0' when the voltage across the second node ND2 is the reference voltage Vref.

A point in time, at which the NOR gate NOR outputs logic '0', may vary depending on whether the resistance of the selected memory cell is a low resistance (a), an intermediate resistance (b), or a high resistance (c). For example, a point in time, at which the NOR gate NOR outputs logic '0', when the resistance of the selected memory cell is a high resistance (c) may lag behind a point in time at which the NOR gate NOR outputs logic '0' when the resistance of the selected memory cell is a low resistance (a) or an intermediate resistance (b).

The write driver 520 includes second to fourth NMOS transistors NM2 to NM4, a first current source CS1, and a second current source CS2. In a cell turn-on period, the first NMOS transistor NM1 is turned on in response to a program enable signal WREN, and the second NMOS transistor NM2 is turned on in response to a bias voltage enable signal VNEGH EN. As the first NMOS transistor NM1 and the second NMOS transistor NM2 are turned on, a bias voltage is supplied to a selected wordline and a selected bitline. As the bias voltage is supplied to the selected wordlines and the selected bitlines, a voltage across the selected memory cell is increased to a threshold voltage. Thus, the selected memory cell is turned on.

In an exemplary embodiment, a holding current is supplied to the selected memory cell to prevent the selected memory cell from being turned off in a holding period following the cell turn-on period. To supply the holding current to the selected memory cell, the second NMOS transistor NM2 is turned off in response to a bias voltage enable signal VNEGH EN and the third NMOS transistor NM3 is turned on in response to a holding enable signal HOLD EN. As the third NMOS transistor NM3 is turned on, the first current source CS1 is connected to the selected memory cell. Thus, a holding current Ihold is supplied to the selected memory cell.

In a programming period following the holding period, an initial program current is supplied to a selected wordline connected to the selected memory cell. The third NMOS transistor NM3 is turned off in response to the hold enable signal HOLD EN to supply the initial program current to the selected wordline connected to the selected memory cell and the fourth NMOS transistor NM4 is turned on in response to a program enable signal IPGM EN. As the fourth NMOS transistor NM4 is turned on, the second current source CS2 is connected to the selected wordline. Thus, an initial program current Ipgm_rst is supplied to the selected memory cell. In an exemplary embodiment, the second power supply voltage VNEG has a level higher than a level of the first power supply voltage VNEGH.

The current adjustment circuit 530 includes fifth to seventh NMOS transistors NM5 to NM7 and a capacitor C. The fifth NMOS transistor NM5 is turned on in response to the program enable signal IPGM EN, and the seventh NMOS transistor is turned on in response to an output signal of the NOR gate NOR.

When the seventh NMOS transistor NM7 enters a turned-on state and the NOR gate NOR outputs logic '1', the capacitor C stores electric charges output from a selected wordline. When the seventh NMOS transistor NM7 enters a turned-on state and the NOR gate NOR outputs logic '0', the capacitor C does not store electric charges output from a selected wordline. A point in time, at which the NOR gate NOR outputs logic '0', when the resistance of the selected memory cell is a high resistance (c) lags behind a point in time at which the NOR gate NOR outputs logic '0' when the resistance of the selected memory cell is a low resistance (a) or an intermediate resistance (b).

Accordingly, the quantity of electric charges stored in the capacitor C when the resistance of the selected memory cell is a high resistance (c) is greater than the quantity of electric charges stored in the capacitor C when the resistance of the selected memory cell is a low resistance (a) or an intermediate resistance (b).

The sixth NMOS transistor NM6 is turned on in response to the voltage across the capacitor C. When the sixth NMOS transistor NM6 is turned on, an additional program current Ipgm_rst_a is supplied to the selected memory cell while discharging the charge accumulated in the capacitor C. Accordingly, the additional program current Ipgm_rst_a supplied to the selected memory cell is increased as the resistance of the selected memory cell is increased.

In an exemplary embodiment, a final program current, supplied to the selected memory cell, corresponds to the sum of the initial program current Ipgm_rst and the additional program current Ipgm_rst_a. Accordingly, the final program current supplied to the selected memory cell is increased as the resistance of the selected memory cell increased.

As described with reference to FIGS. 11A to 11D, since the points in time, at which the selected memory cells are turned off, are different from each other, levels of resistance of the selected memory cells may be detected by detecting points in time at which the selected wordlines are turned off. As described with reference to FIGS. 12A to 12C, since the points in time, at which the selected memory cells are turned off, are different from each other, the resistance of the selected memory cells may be detected by detecting the amount of charges output from the selected wordlines.

Since the points in time, at which the selected memory cells are turned off, are different from each other, a time when current flows to the selected memory cell may vary. For example, the holding voltage of the selected memory cell may be detected by detecting the time when current flows to the selected memory cell. Thus, the resistance of the selected memory cell may be detected by detecting the time when current flows to the selected memory cell.

Figure 13:
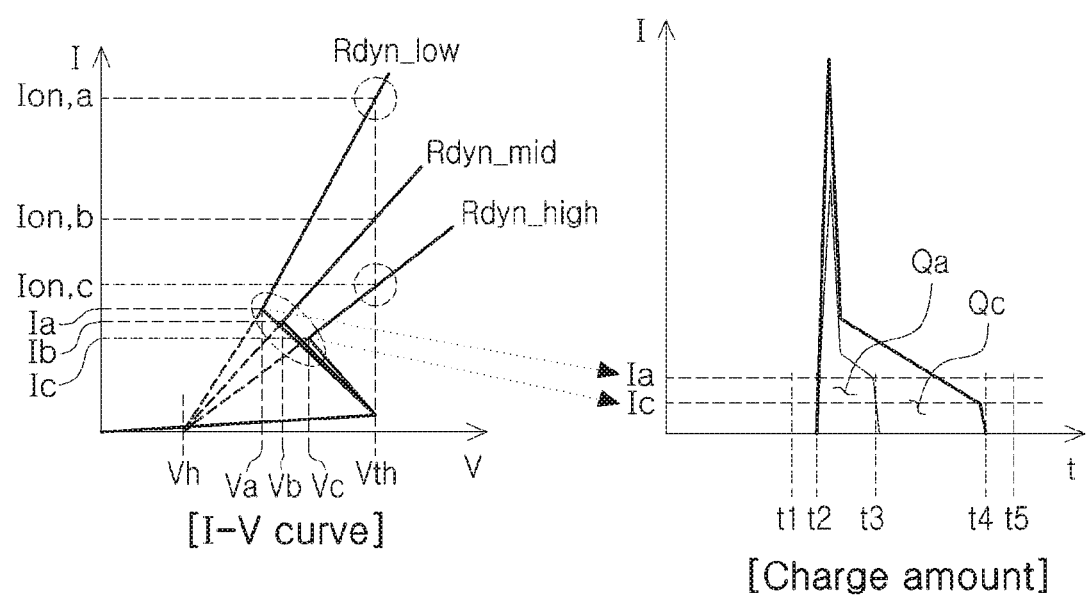
FIG. 13 illustrates a program operation of a memory device according to an exemplary embodiment of the inventive concept.
Figure 14A:
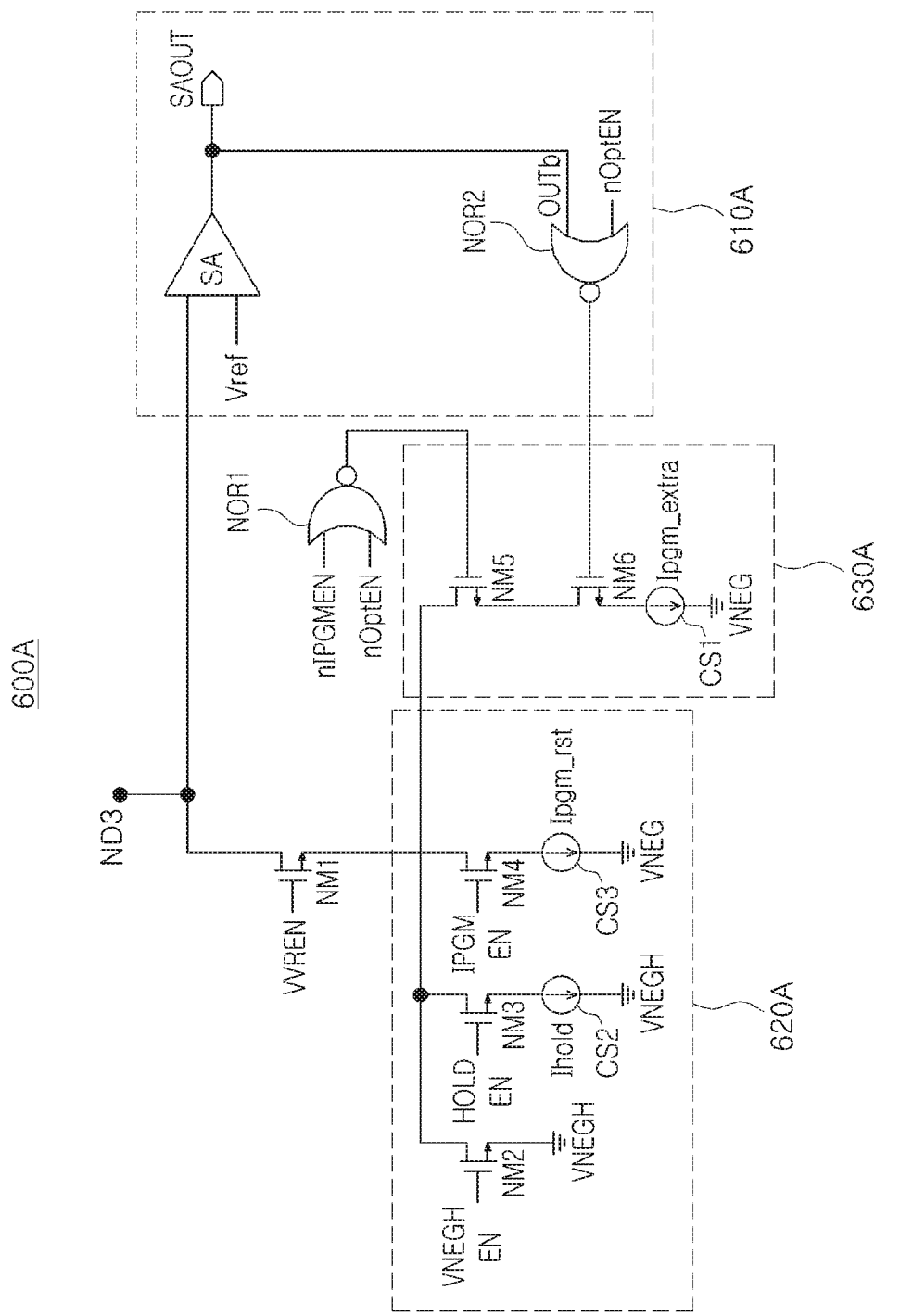
FIGS. 14A and 14B illustrate an example of a program operation according an exemplary embodiment of the inventive concept.
Figure 14B:
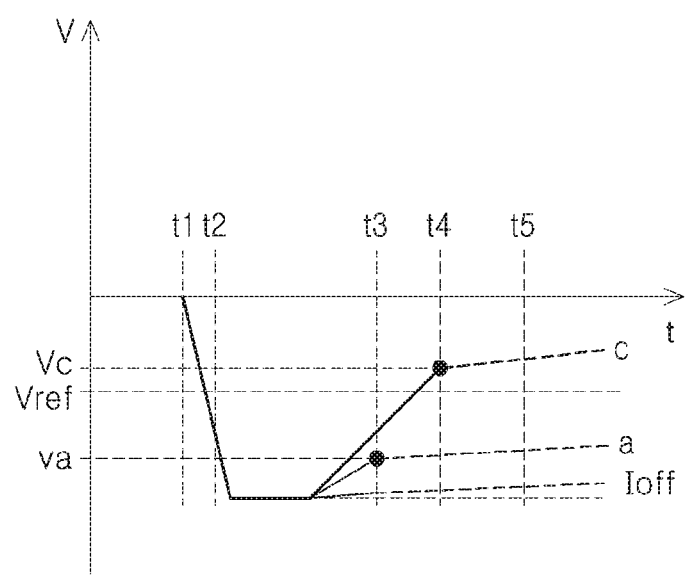
Figure 15A:
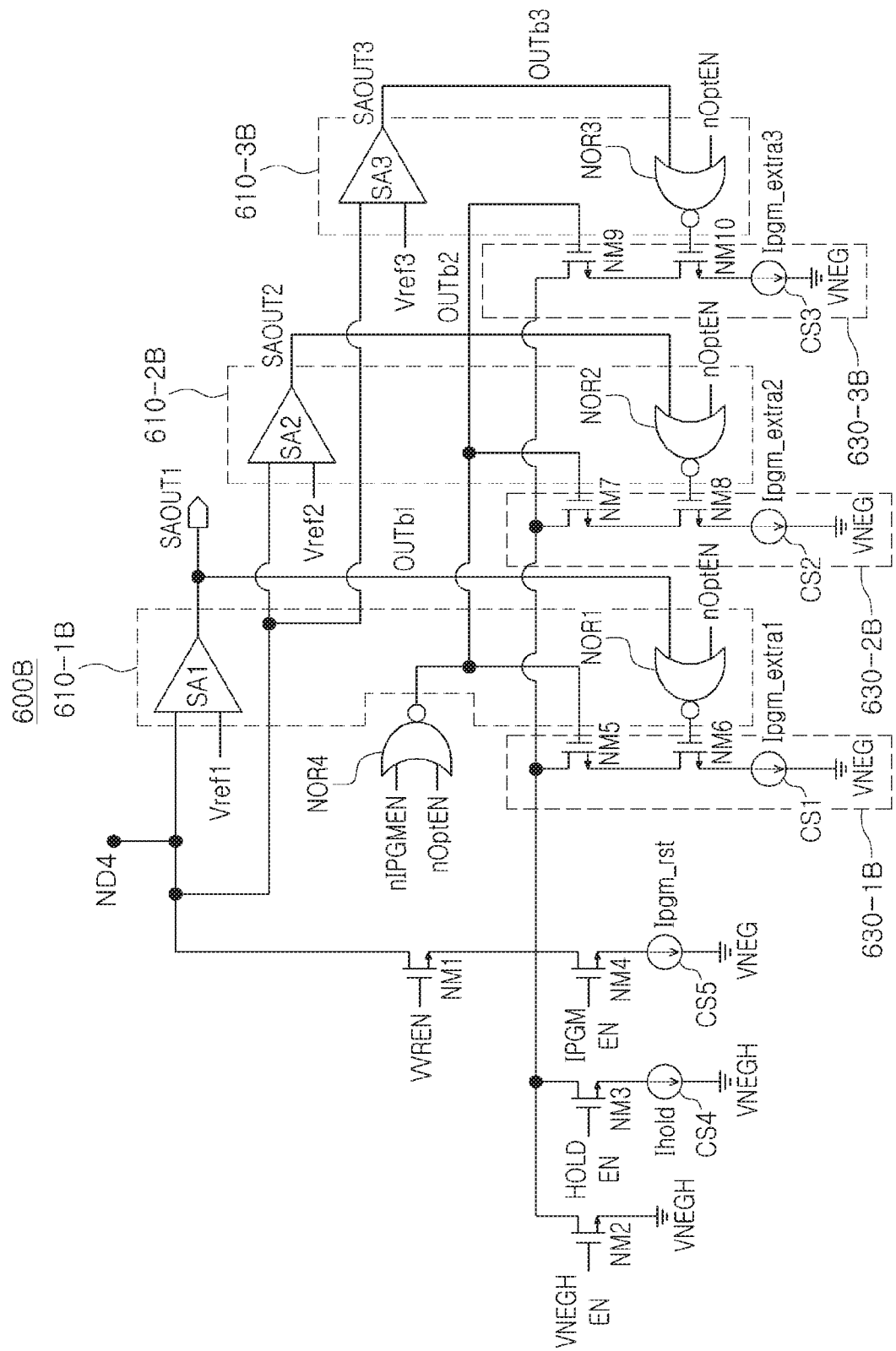
FIGS. 15A and 15B illustrate an example of a program operation according an exemplary embodiment of the inventive concept.
Figure 15B:
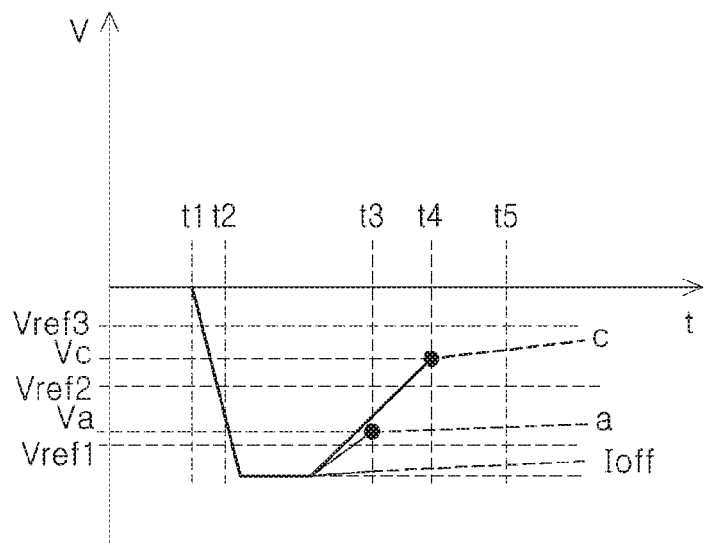

FIG. 13 illustrates a program operation of a memory device according to an exemplary embodiment of the inventive concept. FIGS. 14A and 14B illustrate an example of a program operation according an exemplary embodiment of the inventive concept. FIGS. 15A and 15B illustrate an example of a program operation according an exemplary embodiment of the inventive concept.

Referring to FIG. 13, in a wordline floating period of a pre-reading period, a selected wordline enters a floating state as a selected wordline switch is turned off. When a state of the selected wordline is the floating state, electric charges precharged in the selected wordline are discharged. When the electric charges precharged in the selected wordline are discharged, a voltage across the select memory cell is decreased. When the voltage across the selected memory cell is lower than a holding voltage, the selected memory cell is turned off. Until the selected memory cell is turned off, the quantity of electric charges output from the select wordline may vary depending on resistance of the selected memory cell.

For example, the quantity of electric charges Qc output from the selected wordline when a resistance of the selected memory cell is a high resistance (c) may be greater than the quantity of electric charges Qa output from the selected wordline when the resistance of the selected memory cell is a low resistance (a).

A description will be made with reference to FIG. 14A while focusing on differences from FIG. 12A. Referring to FIG. 14A, a memory device 600A includes a third node ND3, a first NMOS transistor NM1, a holding voltage detector 610A, a write driver 620A, and a current adjustment circuit 630A. The first NMOS transistor NM1, the holding voltage detector 610A, the write driver 620A, and the current adjustment circuit 630A may be included in a programming circuit. The programming circuit may be disposed below a memory cell array. The programming circuit may be connected to a wordline of the memory cell array through the third node ND3. When the wordline is a selected wordline, a voltage across the third node ND3 refers to a voltage of the selected wordline.

A first NOR gate NOR1 receives a complementary signal nIPGMEN of a program enable signal and a complementary signal nOptEN of an option enable signal. Accordingly, the current adjustment circuit 630A operates only when the memory device 600 operates in a first mode during the program operation for the selected memory cell.

Voltages, illustrated in FIG. 14B, may indicate an amount of time-dependent change in the wordline voltage. A reference voltage Vref has a level higher than a level of a first voltage Va and lower than a level of a third voltage Vc. In a wordline floating period, the selected memory cell is turned off at a third point in time t3 when a resistance of the selected memory cell is a low resistance (a) and is turned off at a fourth point in time t4 when the resistance of the selected memory cell is a high resistance (c).

In a pre-reading period, an output signal SAOUT of a comparator SA is always logic '0' and a complementary signal Outb of the output signal SAOUT of the comparator SA is always logic '1' when the resistance of the selected memory cell is a low resistance (a). When a complementary signal nOtpEN of an option enable signal is logic '1' and the complementary signal Outb of the output signal SAOUT of the comparator SA is logic '1', a second NOR gate NOR2 outputs logic '0'. Since the second NOR gate NOR2 always outputs logic '0' in the pre-reading period when the resistance of the selected memory cell is a low resistance (a), an additional program current Ipgm_extra does not flow to the selected wordline during a programming period.

In the pre-reading period, the output signal SAOUT of the comparator SA is logic '1' and the complementary signal Outb of the output signal SAOUT of the comparator SA is a logic '0' in the case in which a selected wordline voltage V is the reference voltage Vref when the resistance of the selected memory cell is a high resistance (c). When the complementary signal nOtpEN of the option enable signal is a logic '1' and the complementary signal Outb of the output signal SAOUT of the comparator SA is a logic '0', the second NOR gate NOR2 outputs logic '1'. Since the second NOR gate NOR2 outputs logic '1' in the pre-reading period when the resistance of the selected memory cell is a high resistance (c), an additional program current Ipgm_extra flows to the selected wordline in a programming period.

In the programming period, the additional program current Ipgm_extra does not flow to the selected wordline when the resistance of the selected memory cell is a low resistance (a) and flows to the selected wordline when the resistance of the selected memory cell is a high resistance (c). Therefore, a final program current supplied to the selected memory cell is increased as the resistance of the selected memory cell is increased.

A description will be made with reference to FIG. 15A while focusing on differences from FIG. 14A. Referring to FIG. 15A, a memory device 600B includes three holding voltage detectors 610-1B to 610-3B and three current adjustment circuits 630-1B to 630-3B. A first NMOS transistor NM1, the holding voltage detectors 610-1B to 610-3B, a write driver, and the current adjustment circuits 630-1B to 630-3B may be included in a programming circuit. The holding voltage detector 630-1B includes NMOS transistors NM5 and NM5, the holding voltage detector 630-2B includes NMOS transistors NM7 and NM8, and the holding voltage detector 630-3B includes NMOS transistors NM9 and NM10. The programming circuit may be disposed below a memory cell array. The programming circuit may be connected to a wordline of a memory cell array through a fourth node ND4. When the wordline is a selected wordline, a voltage across the fourth node ND4 may refer to a voltage of the selected wordline.

Voltages, illustrated in FIG. 15B, may indicate an amount of time-dependent change in a wordline voltage. A first reference voltage Vref1 has a level lower than a level of a first voltage Va. A second reference voltage Vref2 has a level higher than the level of the first voltage Va and lower than a level of a third voltage Vc. A third reference voltage Vref3 has a level higher than the level of the third voltage Vc. In a wordline floating period, the selected memory cell is turned off at a third point in time t3 when a resistance of the selected memory cell is a low resistance (a). In the wordline floating period, the selected memory cell is turned off at a fourth point in time t4 when the resistance of the selected memory cell is a high resistance (c).

In a pre-reading period, an output signal SAOUT1 of a first comparator SA1 is logic '1' and a complementary signal Outb1 of the output signal SAOUT of the first comparator SA1 is logic '0' in the case in which the selected wordline voltage is a reference voltage when the resistance of the selected memory cell is a low resistance (a) or a high resistance (c). Accordingly, a first NOR gate NOR1 outputs logic '1'. As a result, a first additional program current Ipgm_extra1 flows to the selected wordline during a programming period.

In the pre-reading period, an output signal SAOUT2 of a second comparator SA2 is always logic '0' and a complementary signal Outb2 of the output signal SAOUT2 of the second comparator SA2 is always logic '1' when the resistance of the selected memory cell is a low resistance (a). Accordingly, the second NOR gate NOR2 outputs logic '0'. As a result, a second additional program current Ipgm_extra2 does not flow to the selected wordline during the programming period. However, the output signal SAOUT2 of the second comparator SA2 may be logic '1' and the complementary signal Outb2 of the output signal SAOUT2 of the second comparator SA2 may be logic '0' in the case in which the selected wordline voltage is a reference voltage when the resistance of the selected memory cell is a high resistance (c). Accordingly, the second NOR gate NOR2 outputs logic '1'. As a result, a second additional program current Ipgm_extra2 flows to the selected wordline during the programming period.

In the pre-reading period, an output signal SAOUT3 of a third comparator SA3 is always logic '0' and a complementary signal Outb3 of the output signal SAOUT3 of the third comparator SA3 is always logic '1' when the resistance of the selected memory cell is a low resistance (a) or a high resistance (c). Accordingly, the third NOR gate NOR3 outputs logic '0'. As a result, a third additional program current Ipgm_extra3 does not flow to the selected wordline during the programming period.

In the programming period, final program current flowing to a wordline may correspond to a sum of the initial program current Ipgm_rst and the first additional program current Ipgm_extra1 when the resistance of the selected memory cell is low resistance (a). In the programming period, the final program current flowing to the wordline may correspond to a sum of the initial program current Ipgm_rst, the first additional program current Ipgm_extra1, and the second additional program current Ipgm_extra2 when the resistance of the selected memory cell is a high resistance (c). Accordingly, the final program current supplied to the selected memory cell may be increased as the resistance of the selected memory cell is increased.

Figure 16:
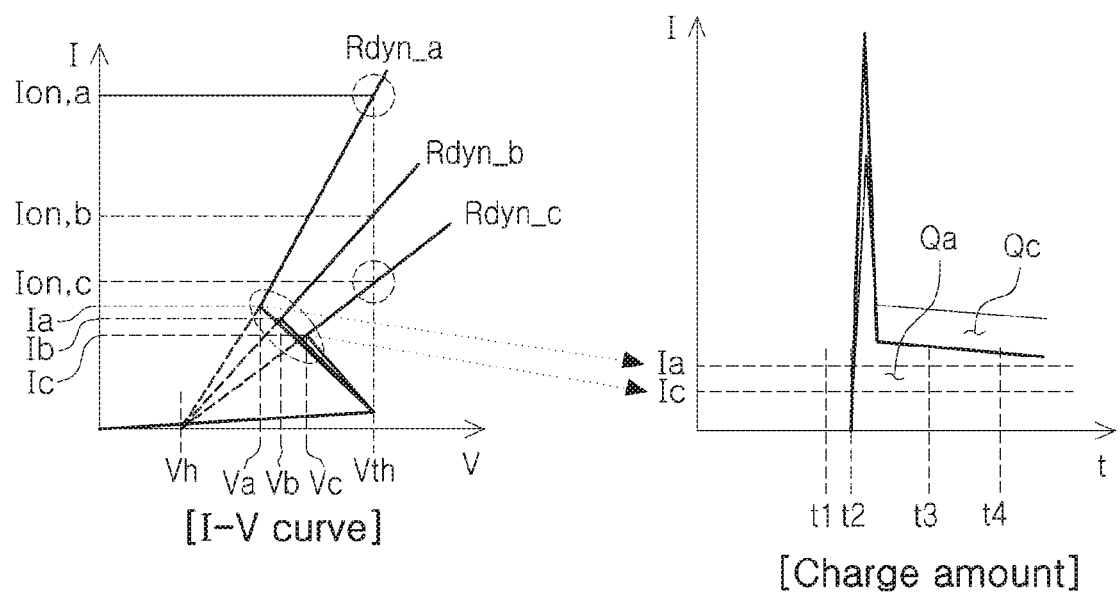
FIG. 16 illustrates a program operation of a memory device according to an exemplary embodiment of the inventive concept.
Figure 17A:
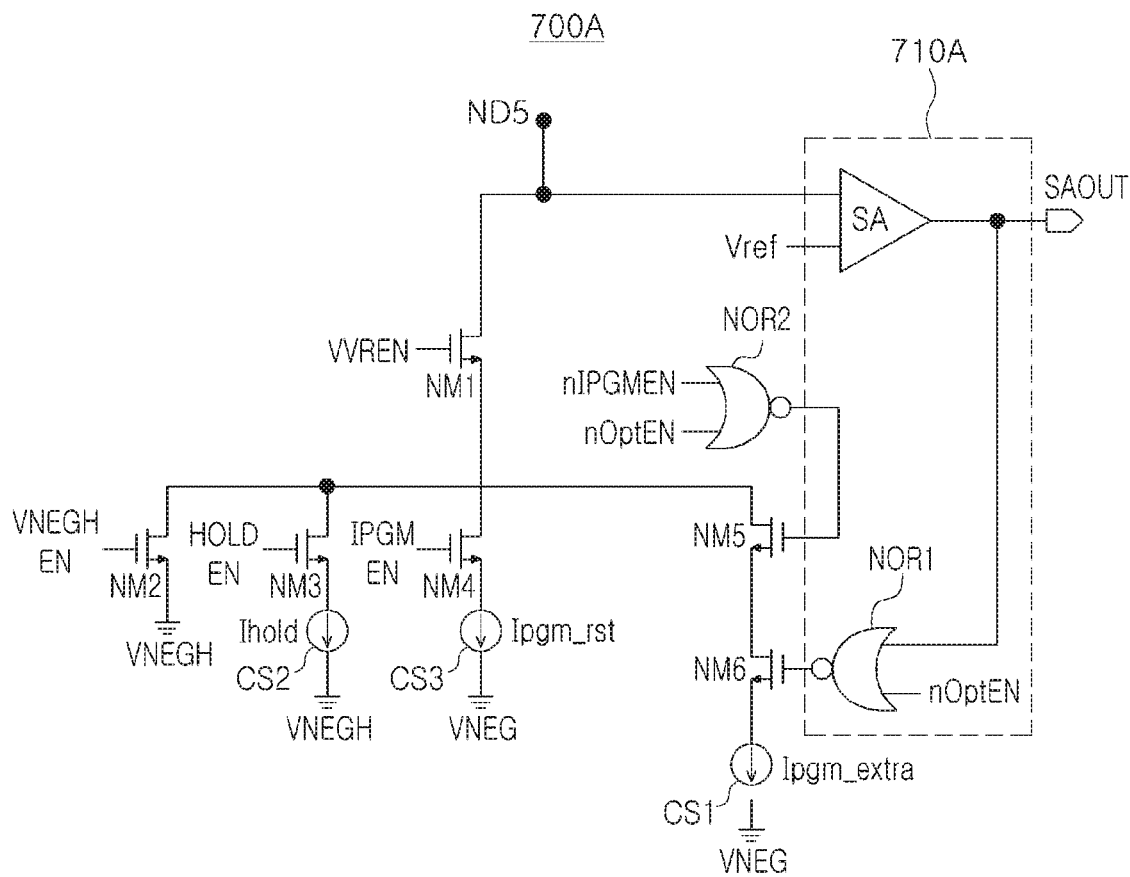
FIGS. 17A and 17B illustrate an example of a program operation according to an exemplary embodiment of the inventive concept.
Figure 17B:
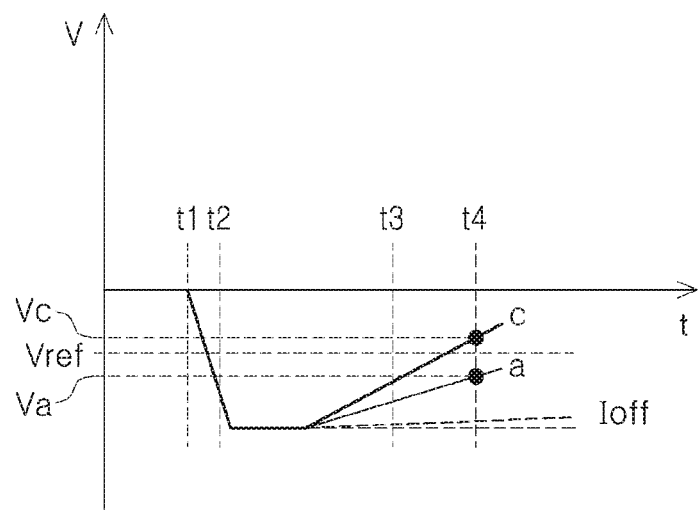
Figure 18A:
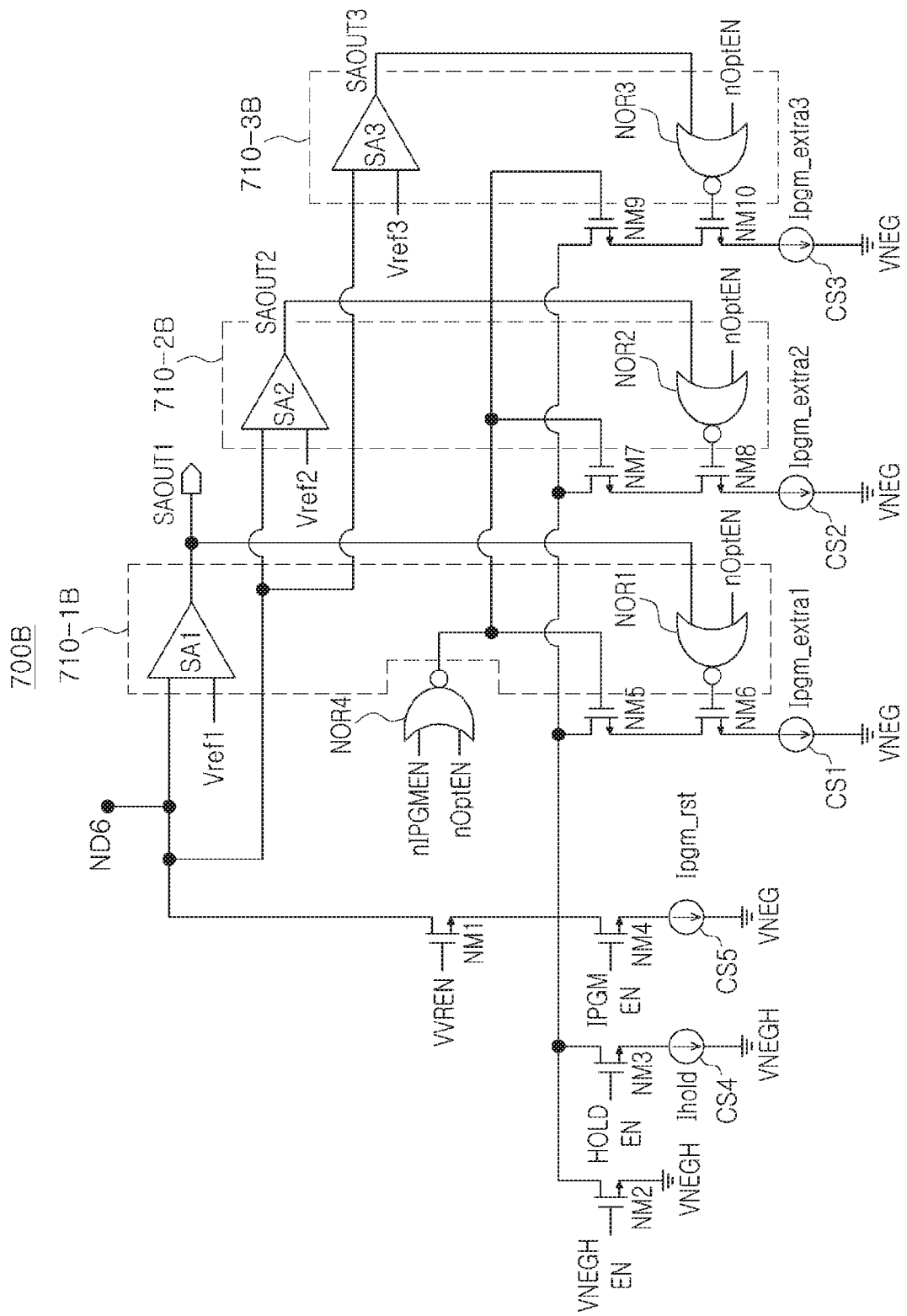
FIGS. 18A and 18B illustrate an example of a program operation according to an exemplary embodiment of the inventive concept.
Figure 18B:
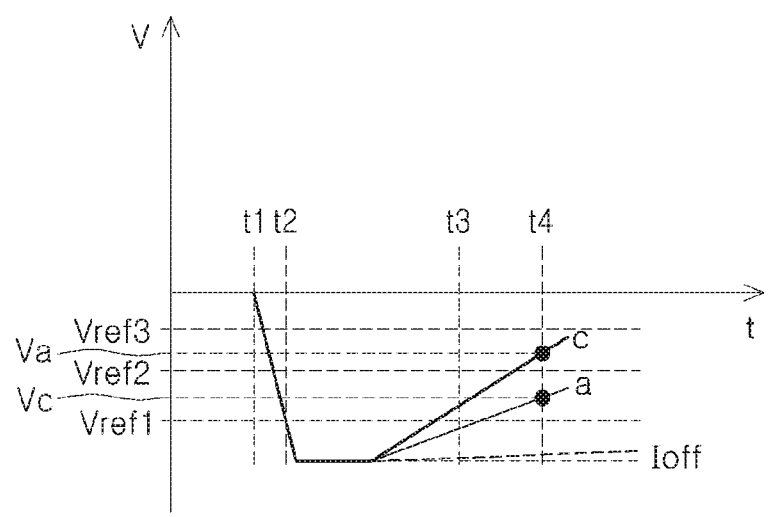

FIG. 16 illustrates a program operation of a memory device according to an exemplary embodiment of the inventive concept, FIGS. 17A and 17B illustrate an example of a program operation according an exemplary embodiment of the inventive concept, and FIGS. 18A and 18B illustrate an example of a program operation according an exemplary embodiment of the inventive concept.

Referring to FIG. 16, a program operation for a selected memory cell includes a cell turn-on period, a holding period, and a programming period but does not include a pre-reading period. The quantity of electric charges, output from a selected wordline, may be detected when a selected memory cell enters a turned-on state. Since the amount of the electric charges output from the selected wordline depends on resistance of the selected memory cell, a program operation may be adjusted depending on the resistance of the select memory cell by detecting the amount of the electric charges output from the selected wordline.

For example, the quantity of electric charges Qc output from the selected wordline when the resistance of the selected memory cell is a high resistance (c) may be greater than the quantity of electrical charges Qa output from the selected wordline when the resistance of the selected memory cell is low resistance (a).

In FIG. 17A, a voltage across a fifth node ND5 refers to a voltage of a selected wordline. In terms of circuit configuration and operation principle, FIGS. 17A and 17B are structurally similar to FIGS. 14A and 14B. However, unlike FIGS. 14A and 14B, referring to FIGS. 17A and 17B, a holding voltage detector 710A detects the quality of electric charges output from a selected wordline when a selected memory cell enters a turned-on state.

In FIG. 18A, a voltage across a sixth node ND6 refers to a voltage of a selected wordline. In terms of circuit configuration and operation principle, FIGS. 18A and 18B are structurally similar to FIGS. 15A and 15B. However, unlike FIGS. 15A and 15B, referring to FIGS. 18A and 18B, holding voltage detectors 710-1B to 710-3B detect the quantity of electric charge output from a selected wordline when the selected memory cell enters a turned-on state.

FIGS. 18A and 18B illustrate an example of a program operation according to an exemplary embodiment of the inventive concept, and FIGS. 20A and 20B illustrate an example of a program operation according to an exemplary embodiment of the inventive concept.

Figure 19:
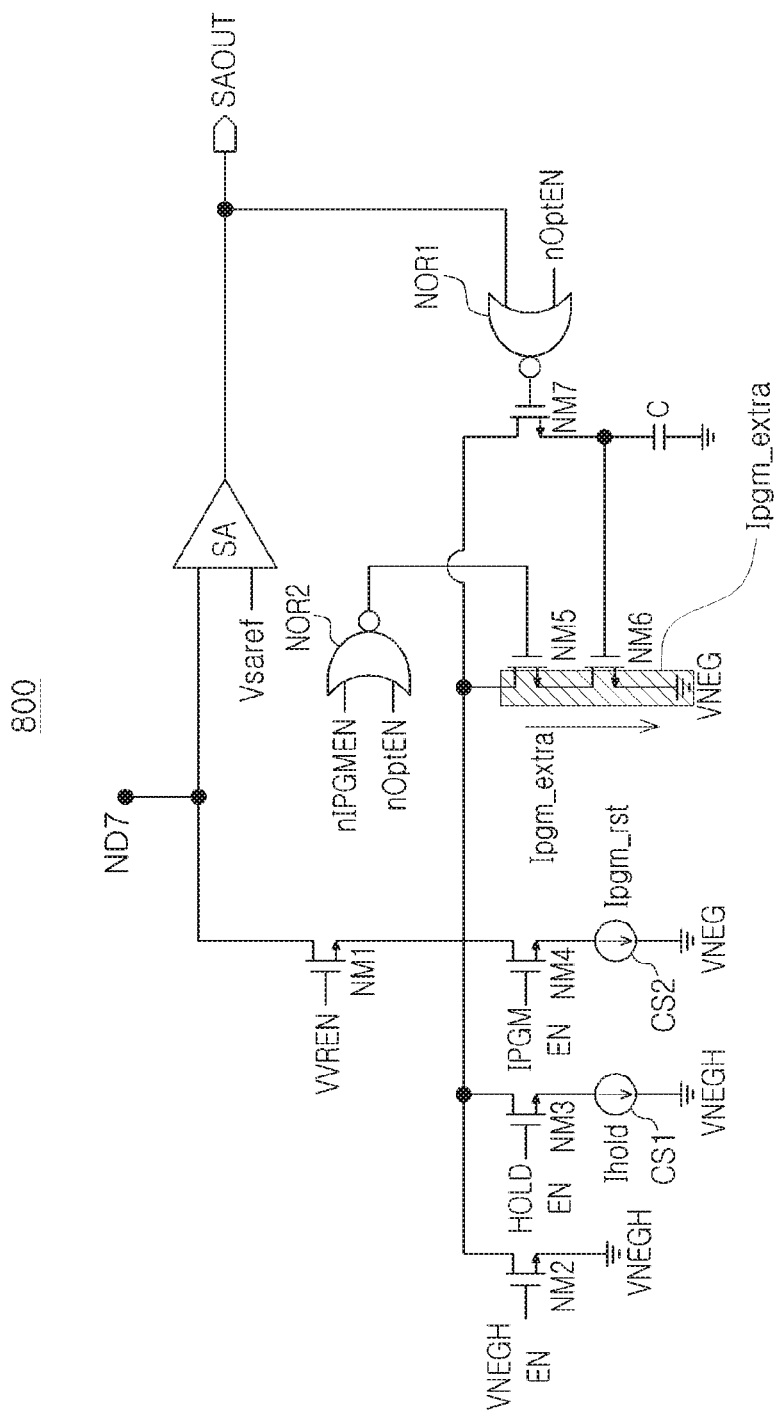
FIG. 19 illustrates an example of a program operation according to an example embodiment.

In FIG. 19, a voltage across a seventh node ND7 refers to a voltage of a selected wordline. Referring to FIG. 19, a second NOR gate NOR2 receives a complementary signal nIPGMEN of a program enable signal and a complementary signal nOptEN of an option enable signal. Accordingly, a current adjustment circuit 800 operates only when a memory device 800 operates in a first mode in a program operation for the selected memory cell.

As resistance of the selected memory cell is increased, the quantity of electric charges output from the selected wordline may be increased until the selected memory cell is turned off. Accordingly, a point in time, at which a first NOR gate NOR1 outputs logic '0', may be delayed as the resistance of the selected memory cell is increased. Thus, the quantity of electric charges stored in a capacitor C may be increased as the resistance of the selected memory cell is increased. The electric charges stored in the capacitor C may be discharged to supply an additional program current Ipgm_extra to the selected memory cell.

In an exemplary embodiment, a final program current supplied to the selected memory cell corresponds to a sum of an initial program current Ipgm_rst and the additional program current Ipgm_extra. Accordingly, the final program current supplied to the selected memory cell may be increased as resistance of the selected memory cell is increased.

Figure 20:
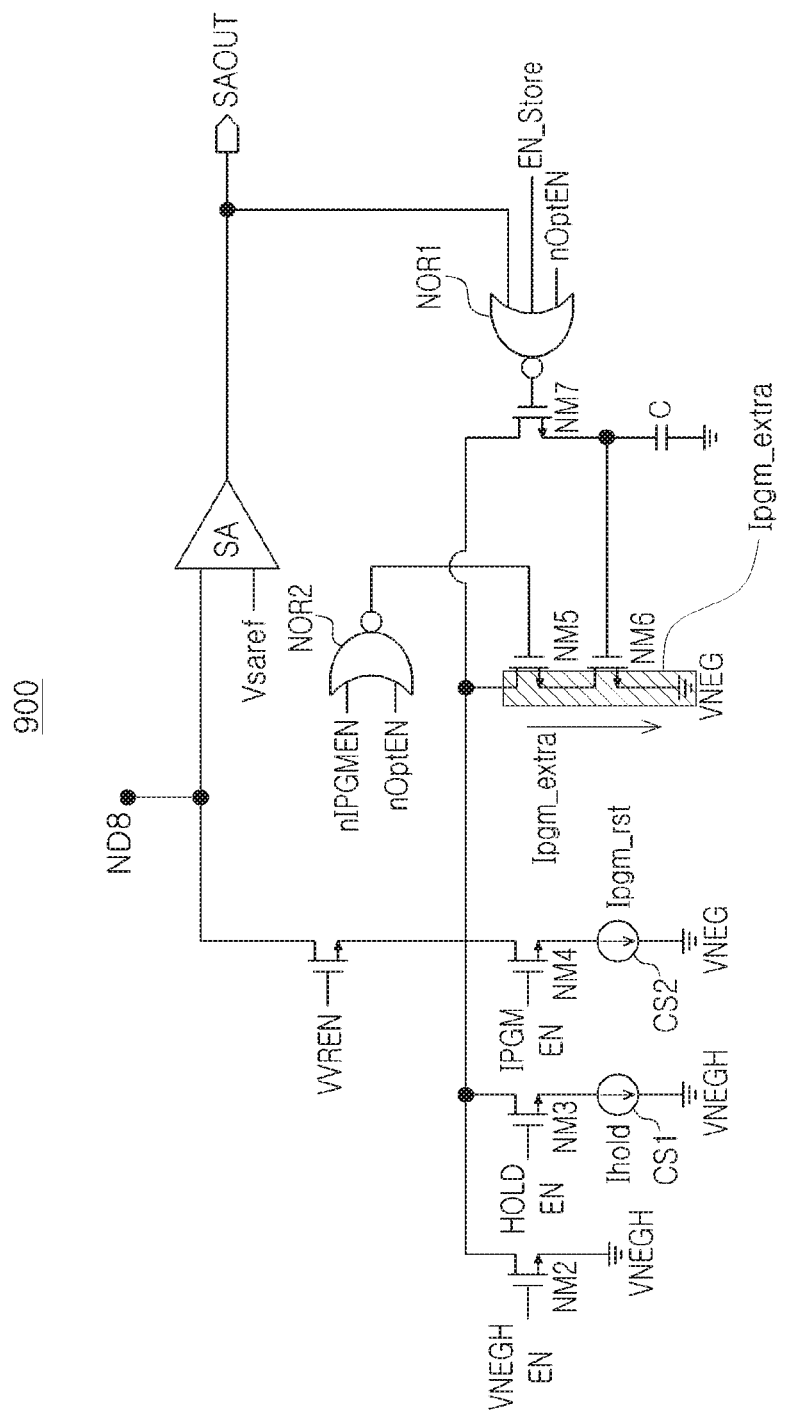
FIG. 20 illustrates a sixth example of a program operation according to an example embodiment.

In FIG. 20, a voltage across an eighth node ND8 refers to a voltage of a selected wordline. Unlike the memory device 800 in FIG. 19, a memory device 900 in FIG. 20 detects the quantity of electric charge output from the selected wordline when a selected memory cell enters a turned-on state. A first NOR gate NOR1 further receives a storage enable signal EN_Store. The storage enable signal EN_Store may be logic '0' at any point in time when the selected memory cell remains in the turned-on state.

For example, referring to FIG. 16, when the storage enable signal EN_Store is logic '1' at a fourth point in time t4, the first NOR gate NOR1 outputs logic '0'. The quantity of electric charges stored in the capacitor C at the fourth point in time t4 may be increased as the resistance of the selected memory cell is increased. The electric charges stored in the capacitor C may be discharged to supply an additional program current Ipgm_extra to the selected memory cell.

In an exemplary embodiment, a final program current supplied to the selected memory cell corresponds to the sum of initial program current Ipgm_rst and the additional program current Ipgm_extra. Accordingly, the final program current supplied to the selected memory cell may be increased as the resistance of the selected memory cell is increased.

Figure 21:
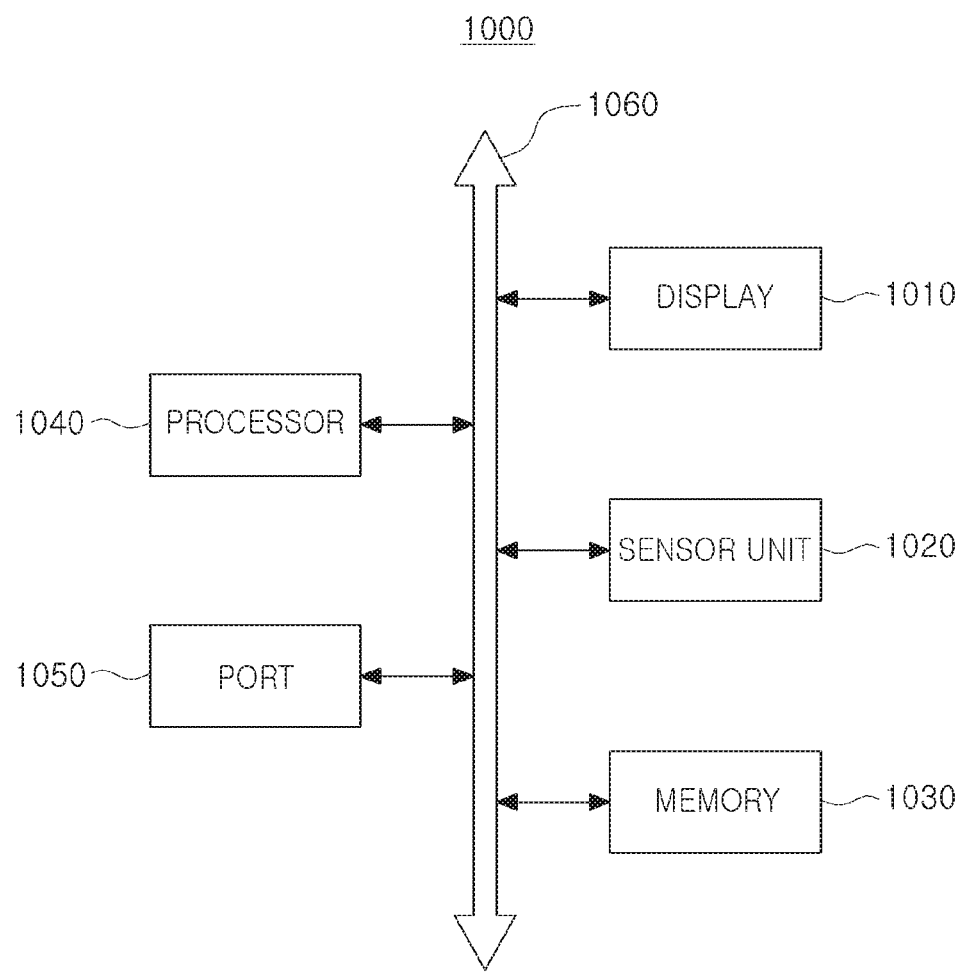
FIG. 21 is a schematic block diagram of an electronic device including a memory device according to an exemplary embodiment of the inventive concept.

FIG. 21 is a schematic block diagram of an electronic device including a memory device according to an exemplary embodiment of the inventive concept.

An electronic device 1000 according to an exemplary embodiment illustrated in FIG. 21 includes a display 1010, a sensor unit 1020, a memory 1030, a processor 1040, a port 1050, and other elements. The electronic device 1000 may further include a wired and wireless communications device and a power supply. Among the elements illustrated in FIG. 21, the port 1050 may be provided for the electronic device 1000 to communicate with a video card, a sound card, a memory card, or a USB device. The electronic device 1000 may include a desktop computer, a laptop computer, a smartphone, a tablet personal computer (PC), or a smart wearable device.

The memory 1030 may be a storage medium storing data for operation of the computing device 1000 or multimedia data. The memory 1030 may include a volatile memory such as a random access memory (RAM), or a nonvolatile memory such as a flash memory. The memory 1030 may include at least one of a solid state drive (SSD), a hard disk drive (HDD), and an optical disc drive (ODD). The sensor unit 1020 may include an input device such as a keyboard, a mouse, or a touch screen, and an output device such as a display or an audio output unit.

The memory 1030 may include a phase change memory device writing, erasing, and reading data using changes in resistance of a phase change material thereof. Additionally, in the exemplary embodiment illustrated in FIG. 21, the memory 1030 may include the memory device described above in the various exemplary embodiments with reference to FIGS. 1 to 20.

As described above, when a selected memory cell is programmed, a holding voltage of the selected memory cell is detected to detect a resistance of the selected memory cell. Further, a program current is determined depending on the detected resistance of the selected memory cell and the determined program current is supplied to the selected memory cell. As a result, a distribution of selected memory cells may be prevented from being broadened.

While exemplary embodiments of the inventive concept have been shown and described above, it will be apparent to those skilled in the art that modifications and variations could be made without departing from the scope of the present inventive concept.

What is claimed is:

1. A memory device comprising:
a plurality of memory cells, each memory cell comprising a switching element and a data storage element including a phase change material, and each memory cell connected to one of a plurality of wordlines and to one of a plurality of bitlines;
a decoder circuit configured to determine at least one of the plurality of memory cells as a selected memory cell in response to an address; and
a programming circuit configured to perform a program operation by turning on the selected memory cell, supplying a holding current to the selected memory cell during a holding period to prevent the selected memory cell from turning off, detecting a holding voltage of the selected memory cell during a period after the holding period in which the supplying is stopped, adjusting a magnitude of a program current based on the detected holding voltage to generate a final program current, and applying the final program current to the selected memory cell,
wherein the selected memory cell is turned off when a voltage across the selected memory cell is lower than the holding voltage.

2. The memory device of claim 1, wherein the programming circuit comprises:

a holding voltage detector configured to detect the holding voltage of the selected memory cell and to output a control signal corresponding to the detected holding voltage;

a current adjustment circuit configured to generate an additional program current having a magnitude adjusted in response to the control signal; and a bias current circuit configured to input a bias current to a selected wordline among the wordlines connected to the selected memory cell and to generate an initial program current corresponding to the bias current.

3. The memory device of claim 2, wherein the final program current is a sum of the initial program current and the additional program current in a program operation for the selected memory cell.

4. The memory device of claim 2, wherein the additional program current has a magnitude varying depending on a resistance of the selected memory cell.

5. The memory device of claim 2, wherein the holding voltage detector detects a voltage of the selected wordline at different points in time from each other and outputs the control signal depending on levels of the voltage of the selected wordline at the different points.

6. The memory device of claim 5, wherein the holding voltage detector comprises:

at least one flip-flop configured to receive the voltage of the selected wordline and to output the voltage of the selected wordline in response to a clock signal; and a logic gate configured to output the control signal based on an output of the flip-flop and an enable signal.

7. The memory device of claim 5, wherein the current adjustment circuit comprises:

a current source configured to supply the additional program current to the selected memory cell; and at least one switch configured to connect the current source and the selected wordline to each other, and wherein the current adjustment circuit controls the at least one switch in response to the control signal.

8. The memory device of claim 2, wherein the holding voltage detector compares a voltage of the selected wordline with a reference voltage to output the control signal.

9. The memory device of claim 8, wherein the holding voltage detector comprises:

a comparator including a first terminal receiving the voltage of the selected wordline, and a second terminal receiving the reference voltage; and a logic gate configured to output the control signal based on an output of the comparator and an enable signal.

10. The memory device of claim 8, wherein the current adjustment circuit comprises:

a capacitor configured to store electric charges output from the selected wordline based on the control signal; and at least one switch configured to supply an additional program current, having a magnitude adjusted based on a quantity of electric charges stored in the capacitor, to the selected memory cell.

11. A memory device comprising:

a memory cell array including a plurality of memory cells disposed at intersections of a plurality of wordlines and a plurality of bitlines;

a decoder circuit configured to determine at least one of the plurality of memory cells as a selected memory cell in response to an address; and a programming circuit configured to input a program current to the selected memory cell to perform a program operation, to detect a holding voltage of the selected memory cell, and to adjust a magnitude of the program current based on the detected holding voltage, wherein the holding voltage is a voltage that prevents the selected memory cell from being turned off, and wherein the programming circuit determines a time when the selected memory cell reaches the holding voltage during a pre-reading period and supplies a program current, having a magnitude adjusted according to the determined time, to the selected memory cell during a programming period following the pre-reading period.

12. The memory device of claim 11, wherein the programming circuit increases the magnitude of the program current as a resistance of the selected memory cell is increased.

13. The memory device of claim 11, wherein the decoder circuit supplies a bias voltage to a selected wordline among the wordlines and a selected bitline among the bitlines, connected to the selected memory cell, during the pre-reading period to set the selected memory cell to a turned-on state, and wherein the programming circuit supplies a minimum current required for the selected memory cell to be maintained in the turned-on state, turns on a wordline switch connected to the selected wordline, and detects the holding voltage of the selected memory cell.

14. The memory device of claim 13, wherein the decoder circuit supplies a bias voltage to the selected wordline and the selected bitline, connected to the selected memory cell, during a cell turn-on period following the pre-reading period to set the selected memory cell to the turned-on state, and wherein the programming circuit supplies a minimum current required for the selected memory cell to be maintained in the turned-on state during a holding period following the cell turn-on state and supplies the program current having the adjusted magnitude to the selected memory cell during the programming period following the holding period.

15. The memory device of claim 11, wherein the programming circuit inputs a bias current to a selected wordline among the wordlines connected to the selected memory cell and generates an initial program current corresponding to the bias current, and wherein the program operation is a sum of the initial program current and an additional program current having a magnitude adjusted by the holding voltage.

16. A memory device comprising:

a memory cell array including a plurality of memory cells disposed at intersections of a plurality of wordlines and a plurality of bitlines;

a decoder circuit configured to determine at least one of the plurality of memory cells as a selected memory cell; and a programming circuit configured to input a holding current and a program current to the selected memory cell to perform a program operation, to detect a holding voltage of the selected memory cell, and to adjust a magnitude of the program current based on the detected holding voltage, wherein the holding current prevents the selected memory cell from being turned off, wherein the decoder circuit supplies a bias voltage to a selected wordline among the wordlines and a selected bitline among the bitlines, connected to the selected memory cell, during a cell turn-on period to set the selected memory cell to a turned-on state, and wherein the programming circuit supplies the holding current to the selected memory cell to maintain the selected memory cell in the turned-on state during a holding period following the cell turn-on period, detects the holding voltage of the selected memory cell after stopping the supply of the holding current and during a programming period following the holding period, and supplies a program current, having a magnitude adjusted by the holding voltage, to the selected memory cell.

17. The memory device of claim 16, wherein the programming circuit increases the magnitude of the program current as a resistance of the selected memory cell is increased.

18. The memory device of claim 16, wherein the programming circuit inputs a bias current to a selected wordline among the wordlines connected to the selected memory cell and generates an initial program current corresponding to the bias current.

19. The memory device of claim 18, wherein the program operation is a sum of the initial program current and an additional program current having a magnitude adjusted by the holding voltage.

20. The memory device of claim 19, wherein the additional program current has a magnitude adjusted depending on a resistance of the selected memory cell.

* * * * *